United States Patent
Kim

(10) Patent No.: US 11,200,931 B2
(45) Date of Patent: Dec. 14, 2021

(54) APPARATUSES AND METHODS FOR SETTING A DUTY CYCLE ADJUSTER FOR IMPROVING CLOCK DUTY CYCLE

(71) Applicant: MICRON TECHNOLOGY, INC., Boise, ID (US)

(72) Inventor: Kang-Yong Kim, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/155,434

(22) Filed: Jan. 22, 2021

(65) Prior Publication Data

US 2021/0151088 A1     May 20, 2021

Related U.S. Application Data

(60) Continuation of application No. 16/995,568, filed on Aug. 17, 2020, now Pat. No. 10,902,897, which is a
(Continued)

(51) Int. Cl.
*G11C 8/00*     (2006.01)
*G11C 7/22*     (2006.01)
(Continued)

(52) U.S. Cl.
CPC .............. *G11C 7/222* (2013.01); *G11C 7/109* (2013.01); *G11C 7/1063* (2013.01); *G11C 7/225* (2013.01);
(Continued)

(58) Field of Classification Search
CPC ......... G11C 7/222; G11C 8/00; G11C 7/1063; G11C 7/225; G11C 11/4076; H03K 5/1565
(Continued)

(56) References Cited

U.S. PATENT DOCUMENTS 5,689,460 A    11/1997   Ooishi
6,396,329 B1    5/2002   Zerbe
(Continued)

FOREIGN PATENT DOCUMENTS

JP     2015162052 A    9/2015
KR    20030045771 A    6/2003
(Continued)

OTHER PUBLICATIONS

U.S. Appl. No. 17/071,107 titled "Apparatuses and Methods for Setting a Duty Cycle Adjuster for Improving Clock Duty Cycle" filed Oct. 15, 2020, pp. all.
(Continued)

*Primary Examiner* — Harry W Byrne
(74) *Attorney, Agent, or Firm* — Dorsey & Whitney LLP

(57) ABSTRACT

Apparatuses and methods for setting a duty cycler adjuster for improving clock duty cycle are disclosed. The duty cycle adjuster may be adjusted by different amounts, at least one smaller than another. Determining when to use the smaller adjustment may be based on duty cycle results. A duty cycle monitor may have an offset. A duty cycle code for the duty cycle adjuster may be set to an intermediate value of a duty cycle monitor offset. The duty cycle monitor offset may be determined by identifying duty cycle codes for an upper and for a lower boundary of the duty cycle monitor offset.

20 Claims, 11 Drawing Sheets

Related U.S. Application Data division of application No. 16/799,599, filed on Feb. 24, 2020, now Pat. No. 10,783,940, which is a division of application No. 16/167,340, filed on Oct. 22, 2018, now Pat. No. 10,600,459.

(60) Provisional application No. 62/677,585, filed on May 29, 2018.

(51) Int. Cl.
*G11C 11/4076* (2006.01)
*H03K 5/156* (2006.01)
*G11C 7/10* (2006.01)

(52) U.S. Cl.
CPC ........ *G11C 11/4076* (2013.01); *H03K 5/1565* (2013.01)

(58) Field of Classification Search
USPC ...................................................... 365/233.1
See application file for complete search history.

(56) References Cited

U.S. PATENT DOCUMENTS

| | | | |
|---|---|---|---|
| 6,700,814 B1 | 3/2004 | Nahas et al. | |
| 6,870,419 B1 | 3/2005 | Garrett, Jr. et al. | |
| 7,414,445 B2* | 8/2008 | Heyne | G06F 1/10 327/149 |
| 7,609,583 B2* | 10/2009 | Booth | G11C 7/22 327/175 |
| 7,990,802 B2* | 8/2011 | Booth | G11C 7/22 365/233.1 |
| 8,189,403 B2 | 5/2012 | Sohn et al. | |
| 8,289,807 B2* | 10/2012 | Booth | G11C 7/22 327/175 |
| 9,202,561 B1 | 12/2015 | Park et al. | |
| 9,263,107 B1 | 2/2016 | Wayland et al. | |
| 9,448,580 B2 | 9/2016 | Kim et al. | |
| 9,449,687 B1 | 9/2016 | Piccardi et al. | |
| 9,805,773 B1 | 10/2017 | Shi et al. | |
| 9,859,932 B2 | 1/2018 | Hwang | |
| 10,249,354 B1 | 4/2019 | Lee et al. | |
| 10,367,493 B1 | 7/2019 | Addepalli et al. | |
| 10,529,398 B1 | 1/2020 | Lee et al. | |
| 10,600,459 B2 | 3/2020 | Kim | |
| 10,715,127 B2 | 7/2020 | Gans | |
| 10,783,940 B2 | 9/2020 | Kim | |
| 10,902,897 B2 | 1/2021 | Kim | |
| 11,003,370 B2 | 5/2021 | Kim et al. | |
| 2003/0221044 A1 | 11/2003 | Nishio et al. | |
| 2004/0075462 A1 | 4/2004 | Kizer et al. | |
| 2004/0135608 A1 | 7/2004 | Pillay et al. | |
| 2004/0243753 A1* | 12/2004 | Horowitz | G06F 13/4072 710/301 |
| 2006/0170453 A1 | 8/2006 | Zerbe et al. | |
| 2007/0075753 A1 | 4/2007 | Parker et al. | |
| 2007/0086267 A1* | 4/2007 | Kwak | G11C 7/02 365/233.1 |
| 2007/0271052 A1 | 11/2007 | Abel et al. | |
| 2008/0036509 A1 | 2/2008 | Jang | |
| 2008/0159017 A1 | 7/2008 | Kim | |
| 2009/0125857 A1 | 5/2009 | Boerstler et al. | |
| 2009/0140785 A1 | 6/2009 | Choi | |
| 2010/0134153 A1 | 6/2010 | Zerbe et al. | |
| 2011/0102039 A1 | 5/2011 | Shin | |
| 2011/0228616 A1* | 9/2011 | Kim | H03L 7/0812 365/189.07 |
| 2012/0086489 A1 | 4/2012 | Cherkassky et al. | |
| 2012/0127214 A1 | 5/2012 | Han | |
| 2012/0194244 A1 | 8/2012 | Kim et al. | |
| 2012/0250426 A1* | 10/2012 | Huang | G11C 7/1066 365/189.07 |
| 2013/0051114 A1 | 2/2013 | Kim et al. | |
| 2014/0253195 A1 | 9/2014 | Chandrasekaran et al. | |
| 2014/0333361 A1 | 11/2014 | Chau et al. | |
| 2015/0097603 A1 | 4/2015 | Amirkhany et al. | |
| 2015/0222254 A1 | 8/2015 | Walker | |
| 2015/0364176 A1 | 12/2015 | Lee | |
| 2016/0197485 A1 | 7/2016 | Nirantare et al. | |
| 2016/0211774 A1 | 7/2016 | Degner et al. | |
| 2016/0261193 A1 | 9/2016 | Karlsson et al. | |
| 2017/0140726 A1 | 5/2017 | Zhu et al. | |
| 2017/0230018 A1 | 8/2017 | Hwang | |
| 2017/0364276 A1 | 12/2017 | Bhuiyan et al. | |
| 2018/0137902 A1 | 5/2018 | Giovannini et al. | |
| 2018/0315461 A1 | 11/2018 | Lee et al. | |
| 2018/0350414 A1 | 12/2018 | Park et al. | |
| 2018/0364752 A1 | 12/2018 | Li et al. | |
| 2019/0081619 A1 | 3/2019 | Kim et al. | |
| 2019/0188159 A1 | 6/2019 | Song et al. | |
| 2019/0237127 A1 | 8/2019 | Moon et al. | |
| 2019/0267056 A1 | 8/2019 | Lee et al. | |
| 2019/0272804 A1 | 9/2019 | Amirkhany et al. | |
| 2019/0371376 A1 | 12/2019 | Kim | |
| 2019/0371377 A1 | 12/2019 | Kim | |
| 2019/0371378 A1 | 12/2019 | Kim | |
| 2019/0385654 A1 | 12/2019 | Lee et al. | |
| 2020/0019345 A1 | 1/2020 | Wang et al. | |
| 2020/0133505 A1 | 4/2020 | Kim | |
| 2020/0133542 A1 | 4/2020 | Krm et al. | |
| 2020/0160902 A1 | 5/2020 | Gans | |
| 2020/0162066 A1 | 5/2020 | Gans | |
| 2020/0194044 A1 | 6/2020 | Kim | |
| 2020/0336137 A1 | 10/2020 | Gans | |
| 2020/0381029 A1 | 12/2020 | Kim | |
| 2021/0027819 A1 | 1/2021 | Kim | |
| 2021/0201971 A1 | 7/2021 | Kim | |

FOREIGN PATENT DOCUMENTS

| | | |
|---|---|---|
| KR | 20110003189 A | 1/2011 |
| KR | 20110097838 A | 8/2011 |
| WO | 2019125948 A1 | 6/2019 |
| WO | 2019164663 A1 | 8/2019 |

OTHER PUBLICATIONS

U.S. Appl. No. 16/198,493, titled "Apparatuses and Methods for Duty Cycle Adjustment of a Semiconductor Device", filed Nov. 21, 2018, pp. all.

U.S. Appl. No. 16/917,428, titled "Apparatuses and Methods for Duty Cycle Adjustment of a Semiconductor Device", dated Jun. 30, 2020, pp. all.

U.S. Appl. No. 16/198,433, titled "Apparatuses and Methods for a Multi-Bit Duty Cycle Monitor", filed Nov. 21, 2018, pp. all.

U.S. Appl. No. 17/202,553 titled "Apparatuses and Methods for Setting a Duty Cycle Adjuster for Improving Clock Duty Cycle" filed Mar. 16, 2021, pp. all.

PCT Application No. PCT/US2018/065738 titled "Apparatuses and Methods for Duty Cycle Error Correction of Clock Signals" filed Dec. 14, 2018, pp. all.

PCT Application No. PCT/US2019/016528, titled "Apparatuses and Methods for Duty Cycle Distortion Correction of Clocks", filed Feb. 4, 2019, pp. all.

PCT Patent Application PCT/US19/62379 titled "Apparatuses and Methods for a Multi-Bit Duty Cycle Monitor" filed Nov. 20, 2019, pp. all.

PCT Patent Application PCT/US19/62385, titled "Apparatuses and Methods for Duty Cycle Adjustment of a Semiconductor Device" filed Nov. 20, 2019, pp. all.

U.S. Appl. No. 15/903,934 entitled 'Apparatuses and Methods for Duty Cycle Distortion Correction of Clocks' filed on Feb. 23, 2018, pp. all.

U.S. Appl. No. 15/853,514, entitled 'Apparatuses and Methods for Duty Cycle Error Correction of Clock Signals', filed Dec. 22, 2017, pp. all.

U.S. Appl. No. 16/274,992, titled "Apparatuses and Methods for Duty Cycle Distortion Correction of Clocks" filed Feb. 13, 2019, pp. all.

(56) References Cited

OTHER PUBLICATIONS

U.S. Appl. No. 16/551,981, titled "Apparatuses and Methods for Duty Cycle Distortion Correction of Clock Signals" filed Feb. 13, 2019, pp. all.
Raja, Immanuel et al., "A 0.1—2-Ghz Quadrature Correction Loop for Digital Multiphase Clock Generation Circuits in 130-nm CMOS", IEEE Transactions on Very Large Scale Integration (VLSI) Systems, vol. 25, Issue 3, Mar. 31, 2017., pp. 1-10.
U.S. Appl. No. 17/495,082 titled "Apparatuses and Methods for Setting a Duty Cycle Adjuster for Improving Clock Duty Cycle" filed Oct. 6, 2021, pp. all pages of the application as filed.
U.S. Appl. No. 17/501,858 titled "Apparatuses and Methods for Duty Cycle Adjustment of a Semiconductor Device" filed Oct. 14, 2021, pp. all pages of the application as filed.

* cited by examiner

| OP[7] | OP[6] | OP[5] | OP[4] | OP[3] | OP[2] | OP[1] | OP[0] |
|---|---|---|---|---|---|---|---|
| RFU | | DCMU1 | DCMU0 | DCML1 | DCML0 | DCM Flip | DCM Start/Stop |

FIG. 4

| Function | Register Type | Operand | Data | Note |
|---|---|---|---|---|
| Duty cycle result for upper byte when DCM Flip=1 (DCMU1) | Read | OP[5] | 0b: High duty cycle < 50% for upper byte | |
| | | | 1b: High duty cycle > 50% for upper byte | |
| Duty cycle result for upper byte when DCM Flip=0 (DCMU0) | | OP[4] | 0b: High duty cycle < 50% for upper byte | |
| | | | 1b: High duty cycle > 50% for upper byte | |
| Duty cycle result for lower byte when DCM Flip=1 (DCML1) | | OP[3] | 0b: High duty cycle < 50% for lower byte | |
| | | | 1b: High duty cycle > 50% for lower byte | |
| Duty cycle result for lower byte when DCM Flip=0 (DCML0) | | OP[2] | 0b: High duty cycle < 50% for lower byte | |
| | | | 1b: High duty cycle > 50% for lower byte | |
| Flip inputs to cancel offset (DCM_Flip) | Write | OP[1] | 0b: No flip | |
| | | | 1b: Flip | |
| DCM_Start/Stop | | OP[0] | 0b: Stop | |
| | | | 1b: Start | |

FIG. 5

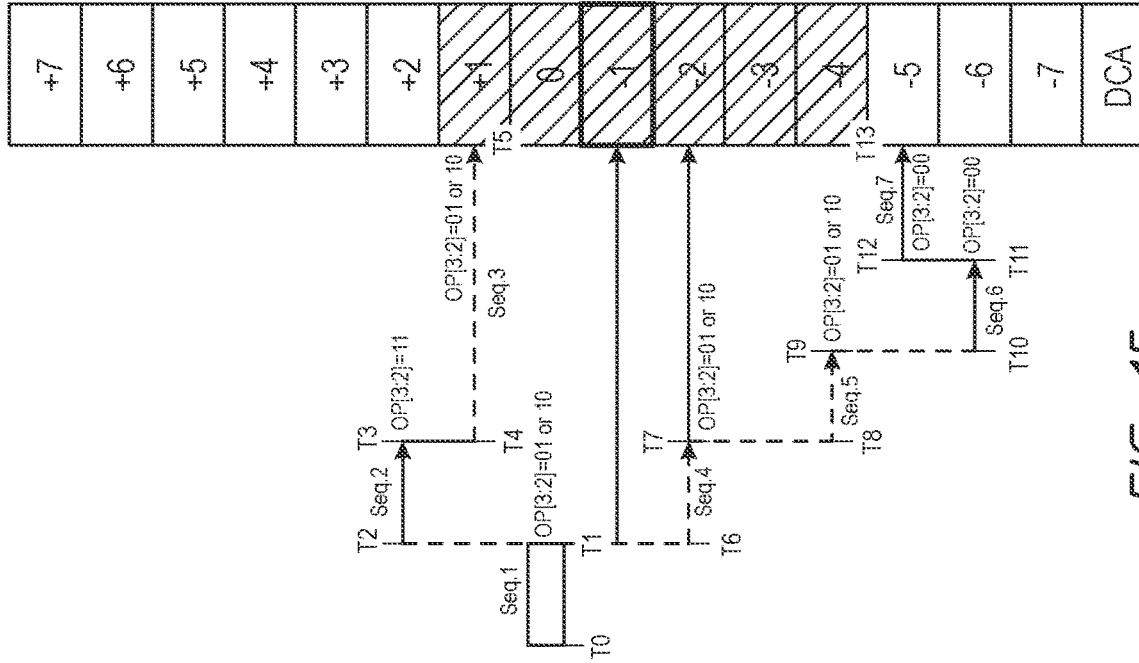

APPARATUSES AND METHODS FOR SETTING A DUTY CYCLE ADJUSTER FOR IMPROVING CLOCK DUTY CYCLE

CROSS-REFERENCE TO RELATED APPLICATIONS

This application is a continuation of pending patent application Ser. No. 16/995,568 filed Aug. 17, 2020, which is a Divisional of patent application Ser. No. 16/799,599, filed Feb. 24, 2020, issued as U.S. Pat. No. 10,783,940 on Sep. 22, 2020, which is a Divisional of patent application Ser. No. 16/167,340, filed on Oct. 22, 2018, issued as U.S. Pat. No. 10,600,459 on Mar. 24, 2020, which claims the filing benefit of U.S. Provisional Application No. 62/677,585, filed May 29, 2018. These applications and patents are incorporated by reference herein in their entirety and for all purposes.

BACKGROUND

Semiconductor memories are used in many electronic systems to store data that may be retrieved at a later time. As the demand has increased for electronic systems to be faster, have greater data capacity, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with commands, memory addresses, and clocks. The various commands, addresses, and clocks may be provided by a memory controller, for example. The commands may control the semiconductor memories to perform various memory operations, for example, a read operation to retrieve data from a memory, and a write operation to store data to the memory. Data may be provided between the controller and memories with known timing relative to receipt by the memory of an associated command.

With newly developed memories, the memories may be provided with system clocks that are used for timing the commands and addresses, for example, and further provided with data clocks that are used for timing of read data provided by the memory and for timing of write data provided to the memory. The memories may also provide clocks to the controller for timing provision of data provided to the controller.

The external clocks provided to the memories are used to provide internal clocks that control the timing of various internal circuits during a memory operation. The timing of the internal circuits during memory operation may be critical, and deviations in the timing of the clocks may cause erroneous operation. An example deviation in the timing of the clocks may be duty cycle distortion, that is, deviation from a 50% duty cycle.

Memories may include duty cycle adjuster circuits that can be used to adjust duty cycle of internal clocks that are generated from the external clocks. The duty cycle adjuster circuits may be set to a setting that adjusts the duty cycle of the internal clocks to improve duty cycle. However, the duty cycle adjustment provided by the duty cycle adjuster circuits may not improve duty cycle sufficiently unless the duty cycle adjuster circuits are set accurately.

BRIEF DESCRIPTION OF THE DRAWINGS

FIG. 4 is a diagram of a mode register related to a duty cycle monitor (DCM) feature according to an embodiment of the disclosure.

FIG. 5 is diagram of opcode definitions for a mode register related to a DCM feature according to an embodiment of the disclosure.

FIG. 14 is a diagram of an operation for setting a DCA circuit according to an embodiment of the disclosure.

FIG. 15 is a diagram of an operation for setting a DCA circuit according to an embodiment of the disclosure.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
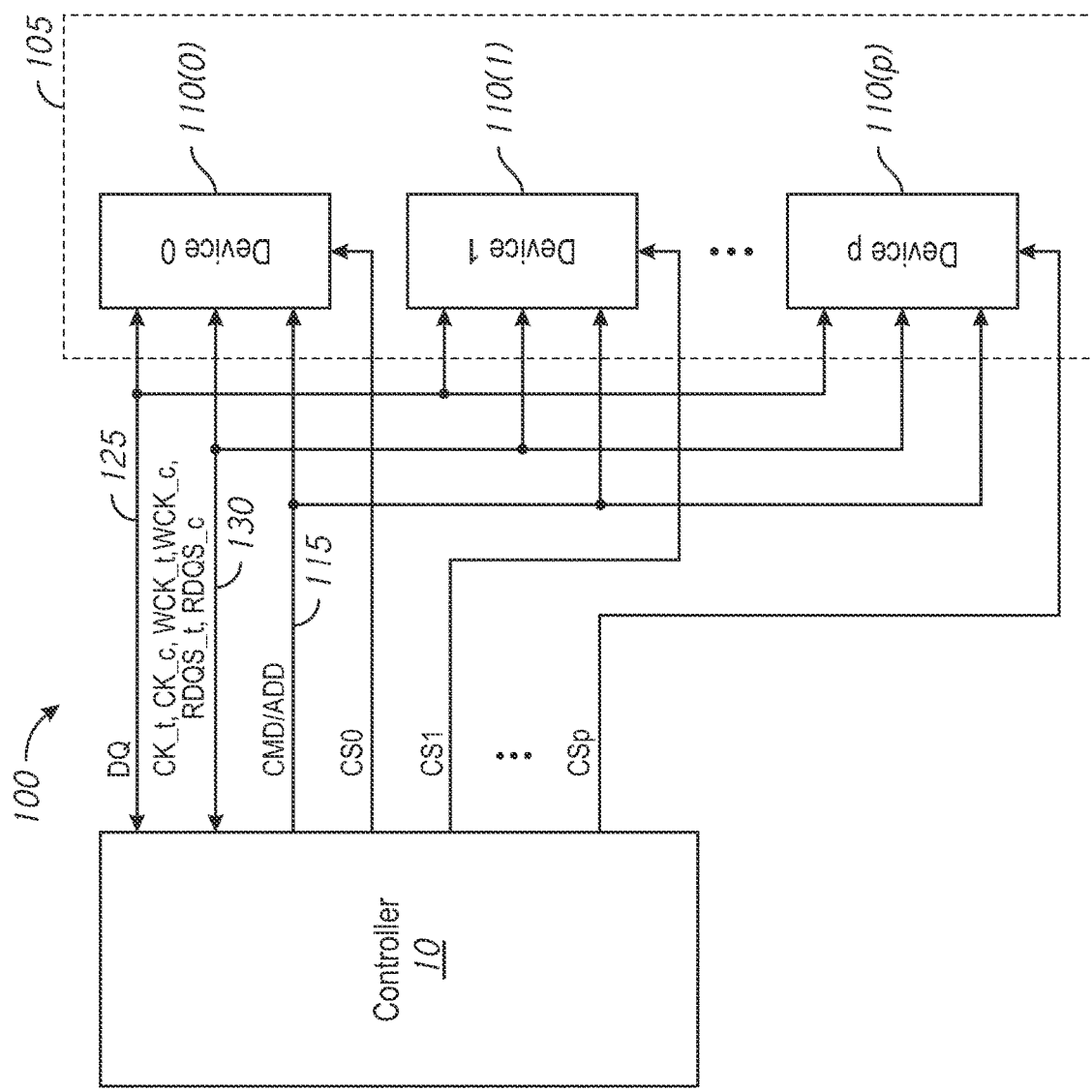
FIG. 1 is a block diagram of a system according to an embodiment of the disclosure.

FIG. 1 is a block diagram of a system 100 according to an embodiment of the disclosure. The system 100 includes a controller 10 and a memory system 105. The memory system 105 includes memories 110(0)-110(p) (e.g., "Device0" through "Devicep"), where p is a non-zero whole number. The memories 110 may be dynamic random access memory (DRAM), such as low power double data rate (LPDDR) DRAM in some embodiments of the disclosure. The memories 110(0)-110(p) are each coupled to the command/address, data, and clock busses. The controller 10 and the memory system 105 are in communication over several busses. For example, commands and addresses are received by the memory system 105 on a command/address bus 115, and data is provided between the controller 10 and the memory system 105 over a data bus 125. Various clock signals may be provided between the controller and memory system 105 over a clock bus 130. The clock bus 130 may include signal lines for providing system clocks CK_t and CK_c received by the memory system 105, data clock WCK_t and WCK_c received by the memory system 105, and access data clocks RDQS_t and RDQS_c provided by the memory system 105 to the controller 10. Each of the busses may include one or more signal lines on which signals are provided.

The CK_t and CK_c clocks provided by the controller 10 to the memory system 105 are used for timing the provision and receipt of the commands and addresses. The WCK_t and WCK_c clocks and the RDQS_t and RDQS_c clocks are used for timing the provision of data. The CK_t and CK_c clocks are complementary, the WCK_t and WCK_c clocks are complementary, and the RDQS_t and RDQS_c clocks are complementary. Clock signals are complementary when a rising edge of a first clock signal occurs at the same time as a falling edge of a second clock signal, and when a rising edge of the second clock signal occurs at the same time as a falling edge of the first clock signal. The WCK_t and WCK_c clocks provided by the controller 10 to the memory system 105 may be synchronized to the CK_t and CK_c clocks also provided by the controller 10 to the memory system 105. Additionally, the WCK_t and WCK_c clocks may have a higher clock frequency than the CK_t and CK_c clocks. For example, in some embodiments of the disclosure, the WCK_t and WCK_c clocks have a clock frequency that is four times the clock frequency of the CK_t and CK_c clocks.

The controller 10 provides commands to the memory system 105 to perform memory operations. Non-limiting examples of memory commands include timing commands for controlling the timing of various operations, access commands for accessing the memory, such as read commands for performing read operations and write commands for performing write operations, mode register write and read commands for performing mode register write and read operations, as well as other commands and operations. The command signals provided by the controller 10 to the memory system 105 further include select signals (e.g., chip select CS signals CS0, CS1, CSp). While all of the memories 110 are provided the commands, addresses, data, and clock signals, the select signals provided on respective select signal lines are used to select which of the memories 110 will respond to the command and perform the corresponding operation. In some embodiments of the disclosure, a respective select signal is provided to each memory 110 of the memory system 105. The controller 10 provides an active select signal to select the corresponding memory 110. While the respective select signal is active, the corresponding memory 100 is selected to receive the commands and addresses provided on the command/address bus 115.

In operation, when a read command and associated address are provided by the controller 10 to the memory system 105, the memory 110 selected by the select signals receives the read command and associated address, and performs a read operation to provide the controller 10 with read data from a memory location corresponding to the associated address. The read data is provided by the selected memory 110 to the controller 10 according to a timing relative to receipt of the read command. For example, the timing may be based on a read latency (RL) value that indicates the number of clock cycles of the CK_t and CK_c clocks (a clock cycle of the CK_t and CK_c clocks is referenced as tCK) after the read command when the read data is provided by the selected memory 110 to the controller 10. The RL value is programmed by the controller 10 in the memories 110. For example, the RL value may be programmed in respective mode registers of the memories 110. As known, mode registers included in each of the memories 110 may be programmed with information for setting various operating modes and/or to select features for operation of the memories. One of the settings may be for the RL value.

In preparation of the selected memory 110 providing the read data to the controller 10, the controller provides active WCK_t and WCK_c clocks to the memory system 105. The WCK_t and WCK_c clocks may be used by the selected memory 110 to generate an access data clocks RDQS_t and RDQS_c. A clock signal is active when the clock signal transitions between low and high clock levels periodically. Conversely, a clock signal is inactive when the clock signal maintains a constant clock level and does not transition periodically. The RDQS_t and RDQS_c clocks are provided by the memory 110 performing the read operation to the controller 10 for timing the provision of read data to the controller 10. The controller 10 may use the RDQS_t and RDQS_c clocks for receiving the read data.

In operation, when a write command and associated address are provided by the controller 10 to the memory system 105, the memory 110 selected by the select signals receives the write command and associated address, and performs a write operation to write data from the controller 10 to a memory location corresponding to the associated address. The write data is provided to the selected memory 110 by the controller 10 according to a timing relative to receipt of the write command. For example, the timing may be based on a write latency (WL) value that indicates the number of clock cycles of the CK_t and CK_c clocks after the write command when the write data is provided to the selected memory 110 by the controller 10. The WL value is programmed by the controller 10 in the memories 110. For example, the WL value may be programmed in respective mode registers of the memories 110.

In preparation of the selected memory 110 receiving the write data from the controller 10, the controller provides active WCK_t and WCK_c clocks to the memory system 105. The WCK_t and WCK_c clocks may be used by the selected memory 110 to generate internal clock signals for timing the operation of circuits to receive the write data. The data is provided by the controller 10 and the selected memory 110 receives the write data according to the WCK_t and WCK_c clocks, which is written to memory corresponding to the memory addresses.

Figure 2:
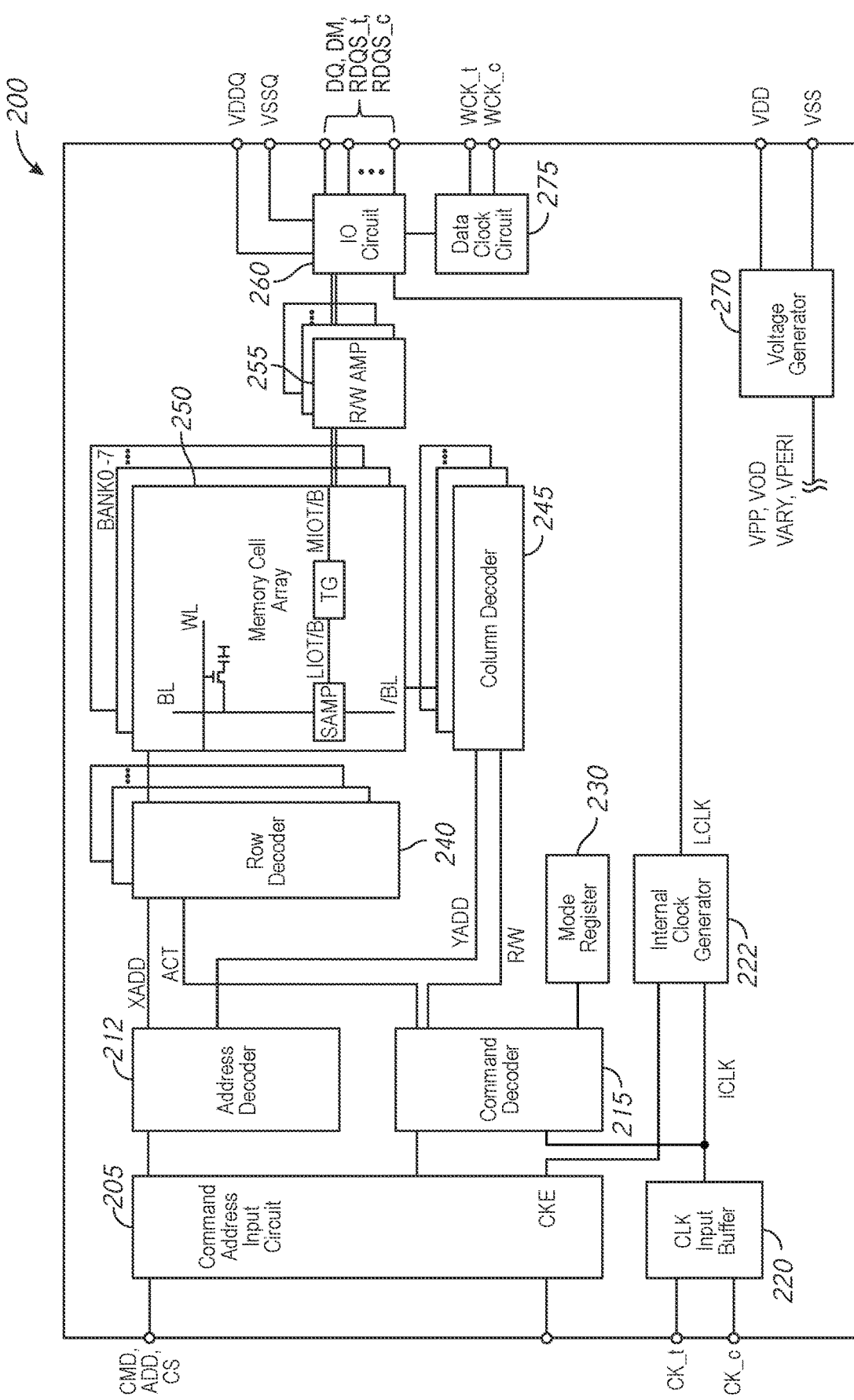
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred to as such. In some embodiments, the semiconductor device 200 may include, without limitation, a DRAM device, such as low power DDR (LPDDR) memory integrated into a single semiconductor chip, for example.

The semiconductor device 200 includes a memory array 250. The memory array 250 is shown as including a plurality of memory banks. In the embodiment of FIG. 2, the memory array 250 is shown as including eight memory banks BANK0-BANK7. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 240 and the selection of the bit lines BL and /BL is performed by a column decoder 245. In the embodiment of FIG. 2, the row decoder 240 includes a respective row decoder for each memory bank and the column decoder 245 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 255 over complementary local data lines (LIOT/B), transfer gate (TG), and complementary main data lines (MIOT/B). Conversely, write data outputted from the read/write amplifiers 255 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 200 may employ a plurality of external terminals that include command and address and chip select (CA/CS) terminals coupled to a command and address bus to receive commands and addresses, and a CS signal, clock terminals to receive clocks CK_t and CK_c, and data clocks WCK_t and WCK_c, and to provide access data clocks RDQS_t and RDQS_c, data terminals DQ and DM, and power supply terminals to receive power supply potentials VDD, VSS, VDDQ, and VSSQ.

The clock terminals are supplied with external clocks CK_t and CK_c that are provided to an input buffer 220. The external clocks may be complementary. The input buffer 220 generates an internal clock ICLK based on the CK_t and CK_c clocks. The ICLK clock is provided to the command decoder 215 and to an internal clock generator 222. The internal clock generator 222 provides various internal clocks LCLK based on the ICLK clock. The LCLK clocks may be used for timing operation of various internal circuits. Data clocks WCK_t and WCK_c are also provided to the external clock terminals. The WCK_t and WCK_c clocks are provided to a data clock circuit 275, which generates internal data clocks based on the WCK_t and WCK_c clocks. The internal data clocks are provided to the input/output circuit 260 to time operation of circuits included in the input/output circuit 260, for example, to data receivers to time the receipt of write data.

The CA/CS terminals may be supplied with memory addresses. The memory addresses supplied to the CA/CS terminals are transferred, via a command/address input circuit 205, to an address decoder 212. The address decoder 212 receives the address and supplies a decoded row address XADD to the row decoder 240 and supplies a decoded column address YADD to the column decoder 245. The CA/CS terminals may be supplied with commands. Examples of commands include timing commands for controlling the timing of various operations, access commands for accessing the memory, such as read commands for performing read operations and write commands for performing write operations, mode register write and read commands for performing mode register write and read operations, as well as other commands and operations.

The commands may be provided as internal command signals to a command decoder 215 via the command/address input circuit 205. The command decoder 215 includes circuits to decode the internal command signals to generate various internal signals and commands for performing operations. For example, the command decoder 215 may provide a row command signal ACT to select a word line and a column command signal R/W to select a bit line.

The command decoder 215 may access mode registers 230 that is programmed with information for setting various modes and features of operation for the semiconductor device 200. For example, the mode registers 230 may be programmed with information related to data access latency, such as read latency or write latency. As another example, the mode registers 225 may be programmed with information related to data burst length. The data burst length defines a number of data bits provided from or to each of the data terminals DQ per access operation (e.g., read or write operation). As another example, the mode registers 230 may be programmed with information for modes related to monitoring internal data clocks that are generated by the data clock circuit 275 based on the WCK_t and WCK_c clocks, as well as information for modes related to changing a timing of the internal data clocks, such as the duty cycle of the internal data clocks. The internal data clocks may be monitored, for example, for duty cycle distortion caused by circuits of the data clock circuit 275, and the timing of the data clocks may be adjusted to compensate for duty cycle error, for example, caused by the circuits of the data clock circuits 275.

The information in the mode registers 230 may be programmed by providing the semiconductor device 200 a mode register write command, which causes the semiconductor device 200 to perform a mode register write operation. The command decoder 215 accesses the mode registers 230, and based on the programmed information along with the internal command signals provides the internal signals to control the circuits of the semiconductor device 200 accordingly. Information programmed in the mode registers 230 may be externally provided by the semiconductor device 200 using a mode register read command, which causes the semiconductor device 200 to access the mode registers 230 and provide the programmed information.

When a read command is received, and a row address and a column address are timely supplied with the read command, read data is read from memory cells in the memory array 250 corresponding to the row address and column address. The read command is received by the command decoder 215, which provides internal commands so that read data from the memory array 250 is provided to the read/write amplifiers 255. The read data is output to outside from the data terminals DQ via the input/output circuit 260. The RDQS_t and RDQS_c clocks are provided externally from clock terminals for timing provision of the read data by the input/output circuit 260. The external terminals DQ include several separate terminals, each providing a bit of data synchronized with a clock edge of the RDQS_t and RDQS_c clocks. The number of external terminals DQ corresponds a data width, that is, a number of bits of data concurrently provided with a clock edge of the RDQS_t and RDQS_c clocks. In some embodiments of the disclosure, the data width of the semiconductor device 200 is 8 bits. In other embodiments of the disclosure, the data width of the semiconductor device 200 is 16 bits, with the 16 bits separated into a lower byte of data (including 8 bits) and a upper byte of data (including 8 bits).

When the write command is received, and a row address and a column address are timely supplied with the write command, write data supplied to the data terminals DQ is written to a memory cells in the memory array 250 corresponding to the row address and column address. A data mask may be provided to the data terminals DM to mask portions of the data when written to memory. The write command is received by the command decoder 215, which provides internal commands so that the write data is received by data receivers in the input/output circuit 260. WCK_t and WCK_c clocks are also provided to the external clock terminals for timing the receipt of the write data by the data receivers of the input/output circuit 260. The write data is supplied via the input/output circuit 260 to the read/write amplifiers 255, and by the read/write amplifiers 255 to the memory array 250 to be written into the memory cell MC. As previously described, the external terminals DQ include several separate terminals. With reference to a write operation, each external terminal DQ receives a bit of data, and the number of external terminals DQ corresponds to a data width of bits of data that are concurrently received synchronized with a clock edge of the WCK_t and WCK_c clocks. As previously described, some embodiments of the disclosure include a data width of 8 bits. In other embodiments of the disclosure, the data width is 16 bits, with the 16 bits separated into a lower byte of 8 bits of data and a upper byte of 8 bits of data.

The power supply terminals are supplied with power supply potentials VDD and VSS. The power supply potentials VDD and VSS are supplied to an internal voltage generator circuit 270. The internal voltage generator circuit 270 generates various internal potentials VPP, VOD, VARY, VTARGET, VPERI, and the like based on the power supply potentials VDD and VSS supplied to the power supply terminals. The internal potential VPP is mainly used in the row decoder 240, the internal potentials VOD and VARY are mainly used in the sense amplifiers SAMP included in the memory array 250, VTARGET may be a target voltage for the internal potential VARY, and the internal potential VPERI is used in many peripheral circuit blocks.

The power supply terminals are also supplied with power supply potentials VDDQ and VSSQ. The power supply potentials VDDQ and VSSQ are supplied to the input/output circuit 260. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 260 so that power supply noise generated by the input/output circuit 260 does not propagate to the other circuit blocks.

Figure 3:
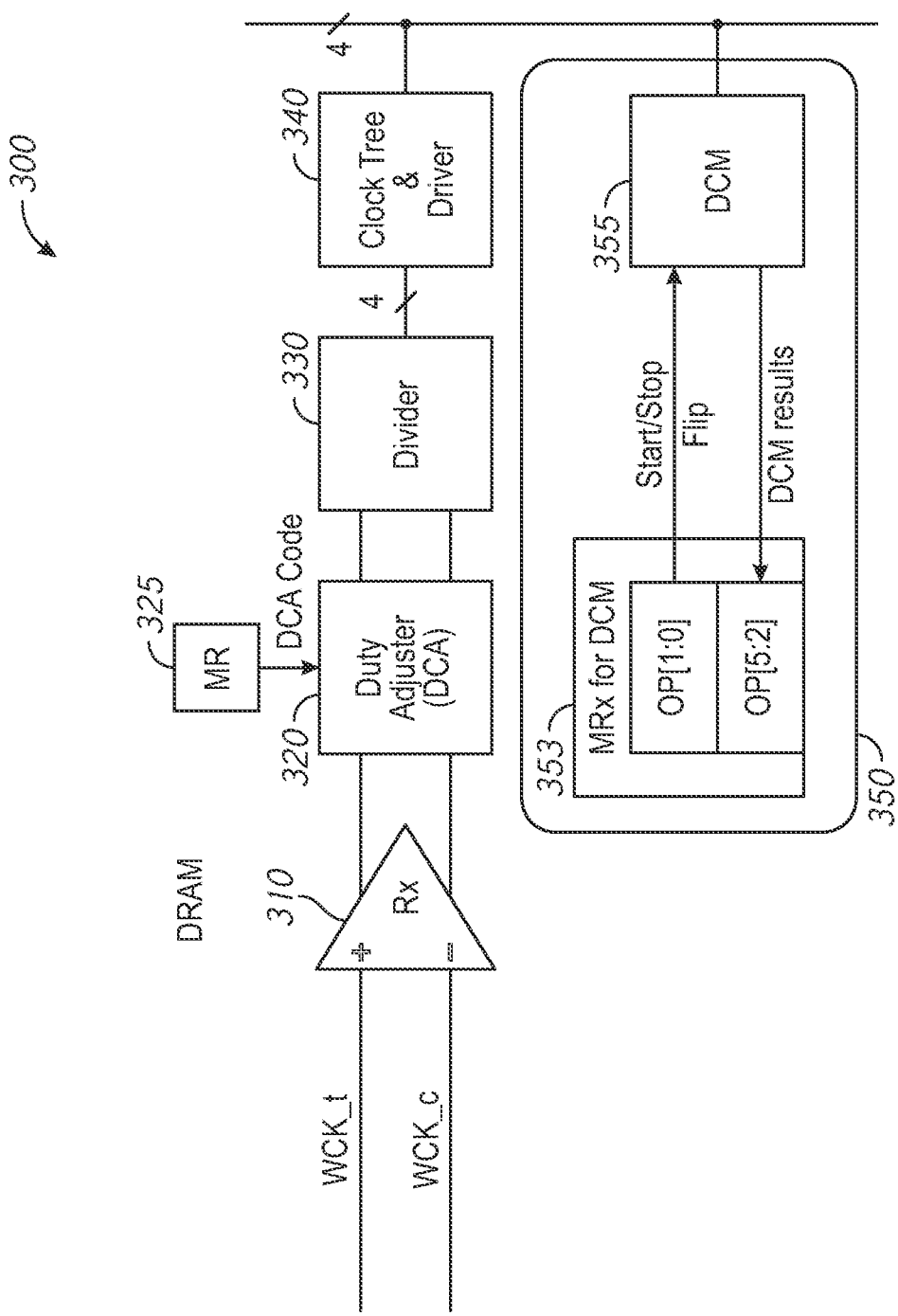
FIG. 3 is a block diagram of a data clock path according to an embodiment of the disclosure.

FIG. 3 is a block diagram of a data clock path 300 according to an embodiment of the disclosure. The data clock path 300 may be included in a data clock circuit. In some embodiments of the disclosure, the data clock path 300 may be included in the data clock circuit 275 of FIG. 2.

The data clock path 300 includes an input clock buffer 310 that is provided external data clocks WCK_t and WCK_c. As previously described, the WCK_t and WCK_c clocks may be complementary. The input clock buffer 310 buffers the WCK_t and WCK_c clocks and provides complementary buffered clocks to a duty cycle adjuster (DCA) circuit 320. The DCA circuit adjusts a timing of the buffered WCK_t and WCK_c clocks to provide timing adjusted WCK_t and WCK_c clocks. The buffered WCK_t and WCK_c clocks are adjusted based on information programmed in a mode register 325. For example, the information programmed in the mode register 325 may be a DCA code that corresponds to various steps of a DCA adjuster range. The timing of the buffered WCK_t and WCK_c clocks are adjusted by programming the DCA code in the mode register 325 (e.g., programmed by a memory controller) corresponding to a desired timing. The timing of the buffered WCK_t and WCK_c clocks may be changed by changing the DCA code programmed in the mode register 325. In embodiments of the disclosure, where the data clock path 300 is included in the data clock circuit of FIG. 2, the mode register 325 may be included in the mode registers 230.

The DCA adjuster circuit provides the timing adjusted WCK_t and WCK_c clocks are provided to a divider circuit 330. The divider circuit 330 provides multiple internal data clock signals that have a clock frequency that is less than a clock frequency of the WCK_t and WCK_c clocks. The multiple internal data clocks may have a phase relationship relative to one another. In some embodiments of the disclosure, the divider circuit 330 provides four internal data clocks have a phase relationship of 90 degrees relative to one another (0 degrees, 90 degrees, 180 degrees, 270 degrees), and have a clock frequency that is one-half of the frequency of the WCK_t and WCK_c clocks. However embodiments of the disclosure are not intended to be limited to this particular number of internal data clocks, phase relationship, and/or clock frequency. The multiple internal data clocks are provided from the divider circuit 330 over a clock tree and driver circuits 340 to circuitry that may be operated according to the internal data clocks. For example, the internal data clocks are provided by the clock tree and driver circuits 340 to input/output circuits (e.g., input/output circuits 260 of FIG. 2) for timing the operation of data receivers to receive write data.

The clock input buffer 310 and the clock tree and drivers 340 may have inherent circuit characteristics that cause undesirable timing changes relative to the WCK_t and WCK_c clocks in providing the internal data clocks. The inherent circuit characteristics may deviate from ideal circuit characteristics due to variations in fabrication processes, as well as variations in operation due to changing temperature and voltage. For example, the clock input buffer 310 and the clock tree and drivers 340 may cause duty cycle to change when providing the internal data clocks, resulting in the internal data clocks having duty cycles that are distorted relative to the external WCK_t and WCK_c clocks. As a result, the timing of the resulting internal data clocks may cause undesirable performance of circuits that are operated according to the internal data clocks.

A duty cycle monitor (DCM) 350 monitors a timing of the internal data clocks provided by the clock tree and driver circuits 340. For example, the DCM 350 may monitor a duty cycle of one or more of the internal data clocks. The DCM 350 includes a DCM circuit 355 and a mode register 353. The DCM circuit 355 monitors one or more of the internal data clocks provided by the clock tree and drivers 340 and provides information indicative of timing of the internal data clocks. The information may include, for example, duty cycle (DCM) results from the monitoring by the DCM circuit 355. Where circuits of the data clock path cause undesirable timing changes in providing the internal data clocks, the DCM 350 may be used to determine the degree of undesirable change. The DCM results may be provided to the mode register 353, where the DCM results may be accessed and provided externally, for example, in response to a mode register read command. The DCM circuit 355 may include circuits for monitoring internal data clocks for upper and lower bytes where a data width includes both upper and lower bytes of data.

The mode register 353 may also be programmed with information that controls operation of the DCM circuit 355.

For example, the information may control when monitoring by the DCM circuit 355 is started and when monitoring by the DCM circuit 355 is stopped. As a further example, the information may control the DCM circuit 355 to change (or "flip") inputs when monitoring the internal data clocks to increase accuracy by monitoring the internal data clocks with a first input condition and then flipping to a second input condition to further monitor the internal data clocks. Accuracy may be increased because in some embodiments of the disclosure, the DCM circuit 355 may have hysteresis in testing the internal data clocks, and as a result, the DCM results may be less accurate if tested without flipping of the inputs. The DCM circuit 355 may also have an inherent DCM offset due to process variations and mismatches in the circuits of the DCM circuit 355 that cause inaccurate measurement of the timing of the internal data clocks. The DCM offset may result in a range of indeterminate DCM results when monitoring the internal data clocks.

Separate DCM results may be provided by the DCM circuit 355 for each input condition and provided to the mode register 353. Moreover, wherein internal data clocks for upper and lower bytes of data are provided, separate DCM results may also be provided for each byte of data.

The information may be programmed in the mode register 353 as opcodes, with the opcodes corresponding to particular bits of the mode register 353. In FIG. 3, the information for controlling the starting and stopping of the DCM circuit 355 and for controlling the flipping of the input condition for monitoring is shown as being programmed as two bits in opcodes OP[1:0] of the mode register 353, and the DCM results provided by the DCM circuit 355 are programmed as four bits in opcodes OP[5:2]. However, the number of bits for the information and the opcodes programmed as previously described may be different for different embodiments of the disclosure, and consequently, the scope of the disclosure is not limited to the particular example shown in FIG. 3.

In some embodiments of the disclosure having a data width including lower and upper bytes of data, a separate clock path is provided for internal clock signals for each byte of data. Each clock path includes circuits for separately monitoring the internal clock signals for each byte of data. For example, in some embodiments of the disclosure, the data path 300 is included for providing, adjusting a timing, and monitoring internal clock signals for a first byte of data, and at least a portion of the data path 300 is duplicated for providing, adjusting a timing, and monitoring internal clock signals for a second byte of data.

A duty cycle monitor (DCM) feature according to an embodiment of the disclosure will be described with reference to FIGS. 4 and 5. FIG. 4 is a diagram of a mode register related to a DCM feature according to an embodiment of the disclosure. FIG. 5 is diagram of opcode definitions for a mode register related to a DCM feature according to an embodiment of the disclosure. The DCM feature described with reference to FIGS. 4 and 5 may be used with a DCM according to an embodiment of the disclosure. For example, in some embodiments of the disclosure, the DCM feature may be used with the DCM 350 of FIG. 3.

The DCM feature allows the memory controller to monitor WCK duty cycle distortion in an internal WCK clock tree. Both lower and upper bytes perform the DCM function simultaneously when DCM is enabled. Two separate duty cycle results are provided for each byte: DCML0 and DCML1 for the lower byte and DCMU0 and DCMU1 for the upper byte.

FIG. 4 is a diagram of a mode register MRx that may be used to program information (e.g., by a memory controller) to control a DCM operation as well as for DCM results to be provided. The mode register MRx is shown as included 8 bits, which represent various opcodes of the mode register MRx. Opcode definitions shown in FIG. 5 may be used with the mode register MRx of FIG. 4 in some embodiments of the disclosure.

DCM operation may be initiated by writing MRx OP[0]=1. Setting MRx OP[0]=0 terminates DCM operation. Prior to initiating DCM operation, WCK clock to CK clock synchronization should be performed. Continuous toggling WCK input is required while DCM operation is enabled until after DCM operation is halted by writing MRx OP[0]=0b.

DCM results may be inaccurate if DCM circuit hysteresis is present. To increase the accuracy of this function, the DCM feature supports flipping the input by setting MRx OP[1] to the opposite state and then repeating the measurement.

Mode register write operations MRW[DCM Flip] and MRW[DCM Stop] may be used by a memory controller to capture the DCM results. The DCM result is determined by the state of DCM Flip bit (MRx OP[1]). For example:
  DCM Flip=0: DCML0 and DCMU0 will be used; and
  DCM Flip=1: DCML1 and DCMU1 will be used.

Figure 6:
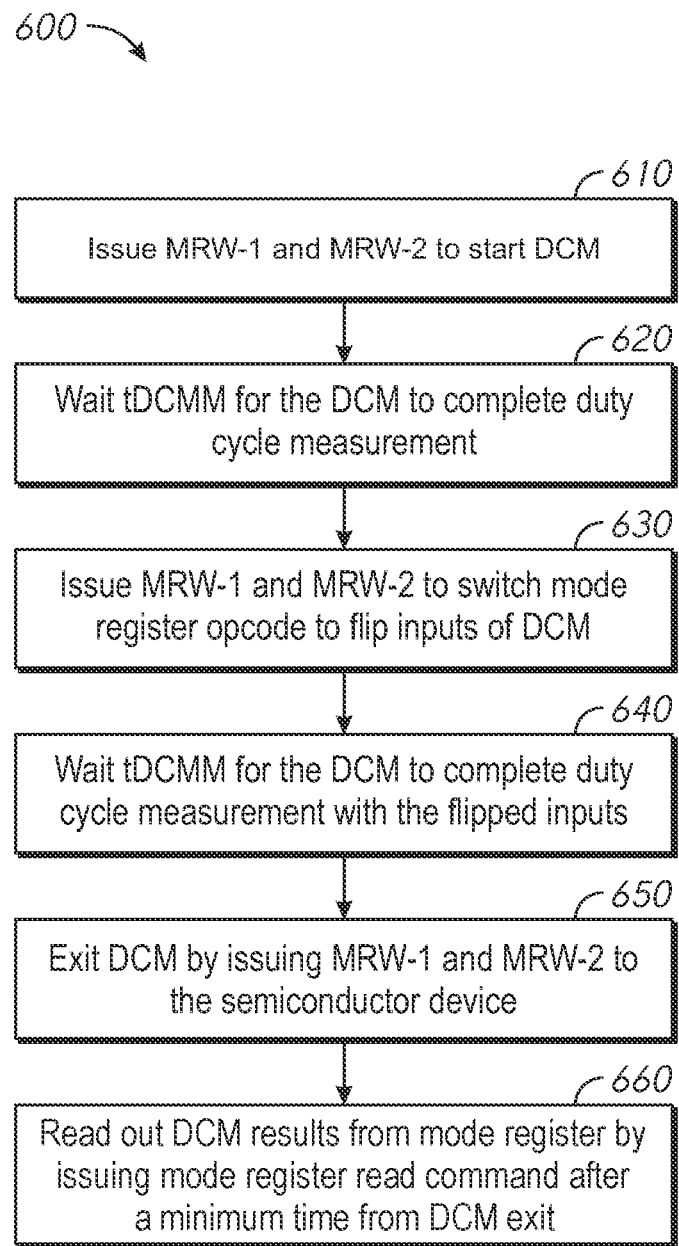
FIG. 6 is a flow diagram of DCM sequence according to an embodiment of the disclosure.
Figure 7:
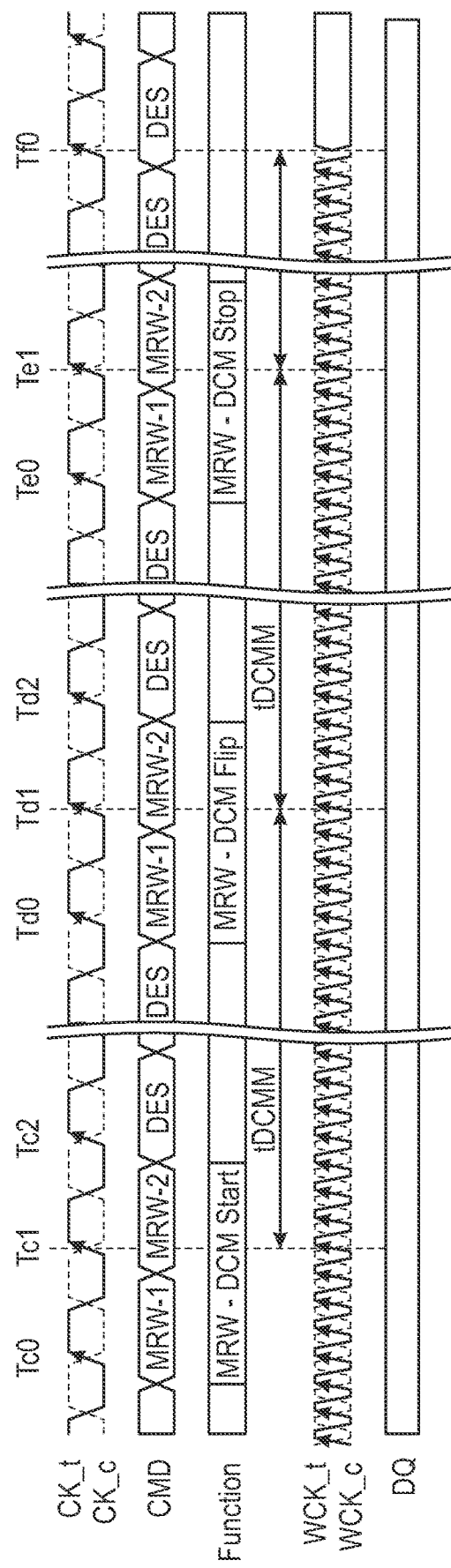
FIG. 7 is a timing diagram for a DCM sequence according to an embodiment of the disclosure.

A duty cycle monitor (DCM) sequence according to an embodiment of the disclosure will be described with reference to FIGS. 6 and 7. FIG. 6 is a flow diagram of DCM sequence 600 according to an embodiment of the disclosure. FIG. 7 is a timing diagram for a DCM sequence according to an embodiment of the disclosure. The DCM sequence described with reference to FIGS. 6 and 7 may be used with a DCM according to an embodiment of the disclosure. For example, in some embodiments of the disclosure, the DCM feature may be used with the DCM 350 of FIG. 3.

In some embodiments of the disclosure, prior to performing the DCM sequence of FIG. 6, DCM training is completed after CBT and WCK2CK leveling so that mode register write (MRW) and mode register read (MRR) operations may be performed. Additionally, frequency set points are updated and the WCK is active at a full-rate before the DCM begins in such embodiments of the disclosure.

The DCM sequence of FIG. 6 will be described with reference to the timing diagram of FIG. 7, and with reference to the mode register MRx of FIG. 4.

At step 610, a mode register write command (including commands MRW-1 and MRW-2) is issued, for example, by a memory controller to a semiconductor device, to start DCM. The mode register write command is received at times Tc0 and Tc1 of FIG. 7. At step 620, wait time tDCMM for the DCM to complete duty cycle measurement. At step 630 a mode register write command is issued to switch MRx OP[1] to flip the inputs of DCM. The mode register write command is received at times Td0 and Td1 of FIG. 7, with tDCMM between times Tc1 and Td1.

Transitioning the flip bit from a logic low to a logic high will automatically: (1) capture the current DCM results; (2) store the DCM results in MRx OP[2]/MRx OP[4]; and (3) reset and restart the DCM. Transitioning the flip bit from a logic high to a logic low will automatically: (1) capture the current DCM results; store the DCM results in MRx OP[3]/MRx OP[5]; and (3) reset and restart the DCM.

At step 640, wait time tDCMM for the DCM to complete duty cycle measurement with the flipped inputs. At step 650 a mode register write command is issued to exit DCM. The mode register command is received at times Te0 and Te1, with tDCMM between times Td1 and Te1. Exiting DCM automatically captures and stores the current DCM results in MRx OP[2]/MRx OP[4] when MRx OP[1] is a logic low, and automatically captures and stores the current DCM results in MRx OP[3]/MRx OP[5] when MRx OP[1] is a logic high.

At step 660, MRx OP[5:2] is read out by issuing an mode register read command MRR after a minimum time from exiting DCM (e.g., at time Tf0) using normal MRR timing to read the DCM results.

The steps described with reference to FIGS. 6 and 7 may be combined in various manners, including adding steps and ignoring steps, without departing from the scope of the disclosure.

Figure 8:
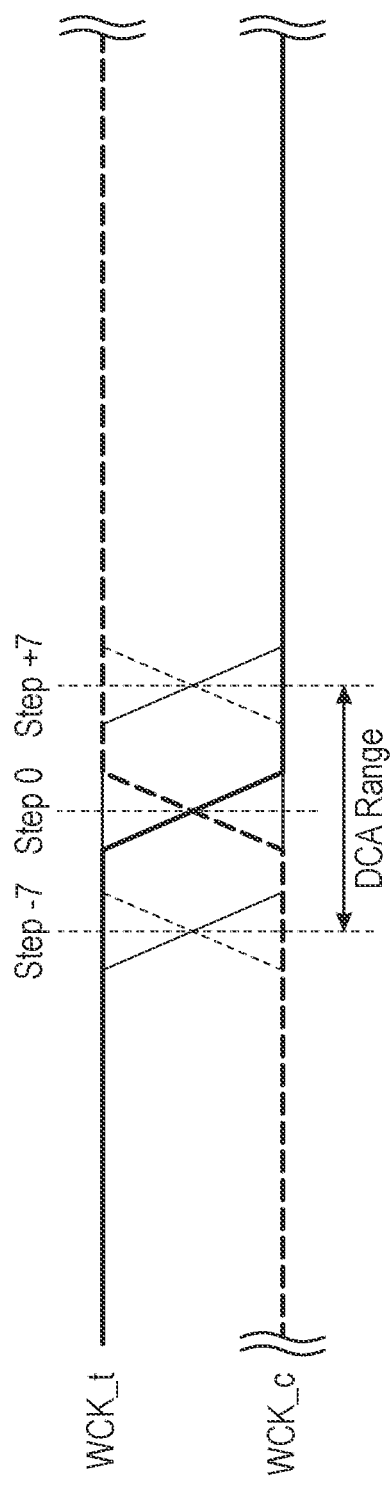
FIG. 8 is an example timing diagram of a duty cycle adjuster (DCA) circuit for an adjuster range according to an embodiment of the disclosure.
Figure 9:
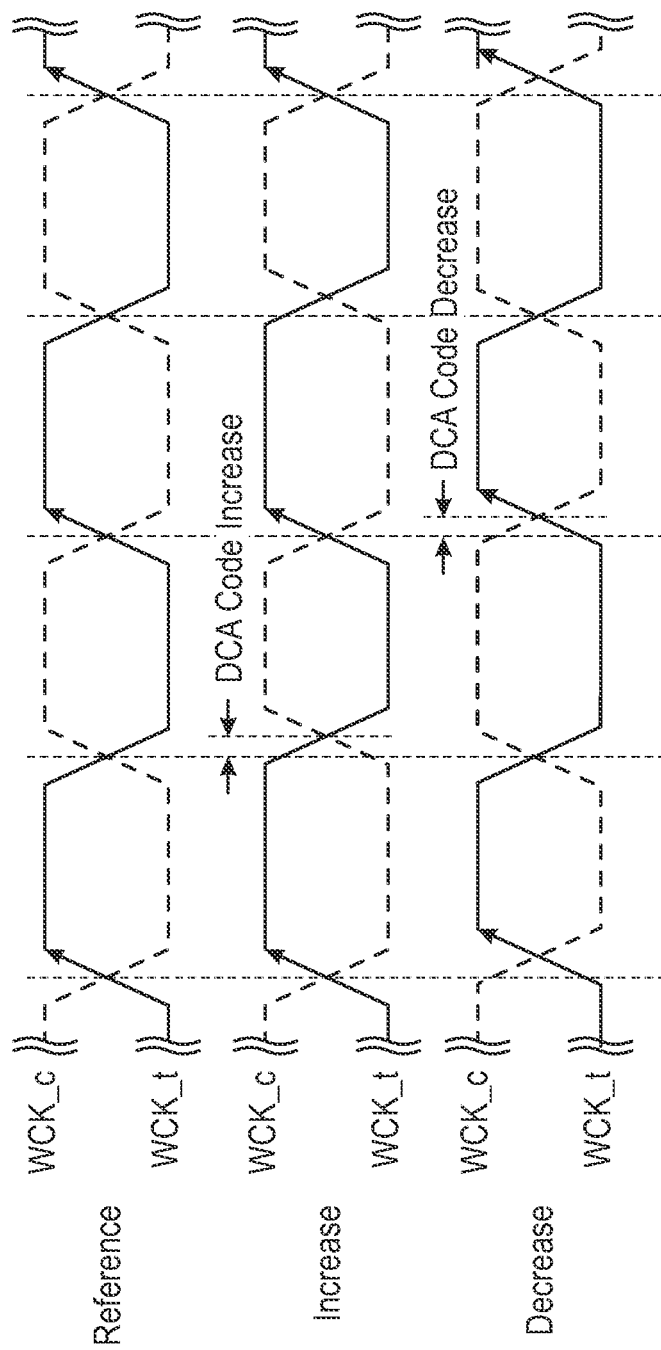
FIG. 9 is an example timing diagram of data clock signals that are adjusted using a DCA feature according to an embodiment of the disclosure.

A duty cycle adjuster (DCA) feature according to an embodiment of the disclosure will be described with reference to FIGS. 8 and 9. FIG. 8 is an example timing diagram of a DCA adjuster circuit for an adjuster range according to an embodiment of the disclosure. FIG. 9 is an example timing diagram of data clock signals that are adjusted using a DCA feature according to an embodiment of the disclosure. The DCA feature described with reference to FIGS. 8 and 9 may be used with a DCA circuit according to an embodiment of the disclosure. For example, in some embodiments of the disclosure, the DCA feature may be used with DCA circuit 320 of FIG. 3.

The DCA feature is a mode-register-adjustable WCK DCA to allow a memory controller to adjust internal WCK clock tree duty cycle to compensate for systemic duty cycle error. The DCA feature adjusts the static internal WCK (e.g., internal WCK_t and WCK_c) duty cycle. The internal WCK may be included in the internal data signals provided by a clock path that receives external WCK_t and WCK_c clocks. A separate DCA may be provided for each byte of data (e.g., DCAL for the Lower Byte adjustment and DCAU for the Upper Byte adjustment).

The WCK DCA may be located before the WCK divider or may equivalent place. The WCK DCA may affect WCK duty cycle during memory operations. For example, the WCK duty cycle may be affected for some of all of the following operations in some embodiments of the disclosure: Read, Read32, Write, Write32, Masked Write, Mode Register Read, Read FIFO, Write FIFO, Read DQ Calibration, and/or Duty Cycle Monitor. A memory controller can adjust the duty cycle of internal clocks by programming information in a mode register, for example, programming information as opcodes of a mode register. For example, in an embodiment of the disclosure including the data path 300 of FIG. 3, the duty cycle may be adjusted by programming information as opcodes of the mode register (MR) 325. Assuming for an embodiment of the disclosure the MR 325 includes opcodes for eight bits, a controller may adjust the duty cycle through the opcode MR OP[3:0] for DCAL and MR OP[7:4] for DCAU settings. Desirable mode register setting for DCA may be determined by the controller in different ways.

FIG. 8 illustrates an example adjustment of internal WCK over a DCA range. In the example of FIG. 8, the DCA includes a range of adjustment of +7 to −7 steps. In this manner, the DCA may be set to one of fifteen different steps of a DCA range to adjust a duty cycle of internal WCK. The difference of actual value between step N and step N+1 (or N−1) may vary because variation of duty cycle by changing DCA may not be linear. Adjusting the DCA by increasing (+) steps increases high duty cycle of WCK, whereas adjusting the DCA by decreasing (−) steps decreases high duty cycle of WCK. FIG. 9 illustrates the increase of the high duty cycle of WCK for DCA code increase and the decrease of the high duty cycle of WCK for DCA code decrease.

Embodiments of the disclosure include changing the DCA code by multiple step sizes (e.g., more than one step size) and/or identifying a DCM offset in terms of a range of DCA codes to identify a DCA code setting for a DCA circuit. Example embodiments of the disclosure will be described in more detail below. Using multiple step sizes may facilitate efficient identification of a DCA code setting for a DCA circuit. The multiple step sizes may be used with a linear search for the range of DCA codes, with a larger step size considered to be a fast speed and a smaller step size considered to be a slow speed. Identifying a DCM offset in terms of a range of DCA codes may improve accuracy in setting a DCA code for a DCA circuit. Intermediate DCA codes in the range of DCA codes for the DCM offset, for example, DCA codes midway (or close to midway) in the range of DCA codes, may be used as an acceptable DCA code setting for a DCA circuit.

FIGS. 10-15 are diagrams of operations for setting a duty cycle adjuster (DCA) circuit according to some embodiments of the disclosure. The operation may be used by a memory controller to set the DCA circuit to adjust timing of internal clock signals, for example, to adjust an internal clock tree duty cycle, to compensate for systemic duty cycle error of a semiconductor device. The operations of FIGS. 10-15 may be used with any combination of embodiments of the disclosure previously described with reference to FIGS. 1-9. Commands may be issued, for example, by a memory controller to a semiconductor device, to perform the operations as described below for FIGS. 10-15. Specific reference to the particular commands issued and to the issuance of the particular commands has been omitted in the description below in the interests of brevity. However, the issuance of the commands and when the commands are issued to perform the operations are intended to be within the scope of the disclosure.

FIGS. 10-15 each shows an operation that includes performing duty cycle monitor (DCM) sequences to determine duty cycle results (DCM results), and adjusting a DCA circuit based on the DCM results to reach an optimal setting for a DCA circuit. In some embodiments of the disclosure, the DCM sequences may include the DCM sequence of FIG. 6. A DCM sequence having a timing as shown in FIG. 7 may be included in the DCM sequences in some embodiments of the disclosure. The DCA results determined by the operation of FIG. 10 may defined as shown in FIG. 5 in some embodiments of the disclosure. The DCM results may be provided in a mode register as shown in FIG. 4 in some embodiments of the disclosure.

In the example operations of FIG. 10-15, the DCA circuit that is adjusted based on the DCM results includes a range of adjustment of +7 to −7 steps. In this manner, the DCA circuit may be set to one of fifteen different steps to adjust a duty cycle of an internal data clock, for example, an internal WCK (e.g., including internal WCK_t and/or WCK_c). The example operations of FIGS. 10-15 will also be described with reference to the DCA circuit 320 and the DCM 350 of the clock path 300 of FIG. 3. Additionally, each DCM sequence may provide two DCM results. For example, one DCM result is provided for a first input condition for the DCM (e.g., a first DCM flip setting) and a second DCM result is provided for a second input condition for the DCM (e.g., a second DCM flip setting). The DCM results may be provided in a mode register in some embodiments of the disclosure. For example, each of the DCM results may be provided as a respective opcode of the mode register. In embodiments of the disclosure where the DCM results are provided in the mode register as shown in FIG. 4, the two opcodes determined during a DCM sequence of the example operation of FIG. 10 may correspond to opcodes OP[2] and OP[3], with OP[2] providing the DCM results for a first DCM flip setting (e.g., with no flip) and with OP[3] providing the DCM results for a second DCM flip setting (e.g., with flip). In embodiments of the disclosure that include upper and lower bytes of data, additional DCM results may be provided from the DCM sequence for the other byte of data.

Figure 10:
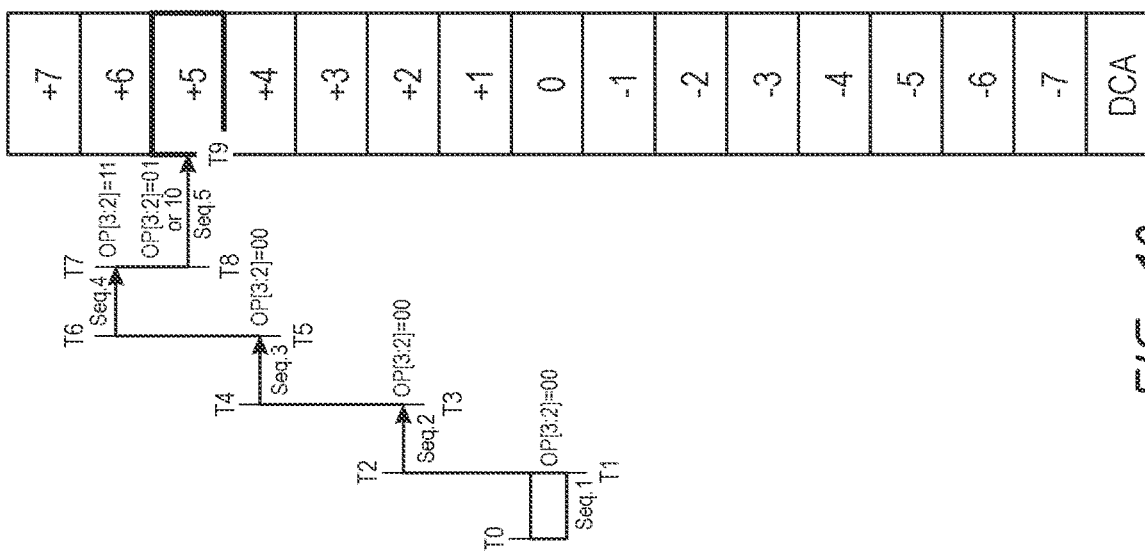
FIG. 10 is a diagram of an operation for setting a DCA circuit according to an embodiment of the disclosure.

FIG. 10 is a diagram of an operation for setting a DCA circuit according to an embodiment of the disclosure. The DCA circuit of the example operation of FIG. 10 is considered to not have any DCM offset. That is, the DCA circuit does not include a range of measurement error resulting from circuit variation and mismatch.

Prior to time T0, the DCA circuit is set to an adjustment of 0, for example, following an initialization of the DCA circuit. At time T0 a first DCM sequence is started and at time T1 the first DCM sequence is stopped, for example, by a memory controller issuing appropriate commands to a memory. During the first DCM sequence between times T0 and T1, first DCM results are determined. As previously described, a DCM sequence of the example operation of FIG. 10 provides two DCM results, each corresponding to a different condition for the DCM, for example, with no DCM flip and with DCM flip. The two DCM results will be described as corresponding to opcodes OP[3:2] of a mode register. In the example operation of FIG. 10, the DCM results from the first DCM sequence are OP[3:2]=00. The 00 results indicate that the high duty cycle for both conditions is less than 50%. The first DCM results are evaluated by a memory controller, for example, and commands are issued so that opcodes for setting the DCA circuit are changed by the memory controller to cause an increase in the high duty cycle of internal clocks. As shown in FIG. 10, the DCA circuit is adjusted by a first step size, for example, 2 steps, following time T1 to increase the setting of the DCA circuit to +2 and increase the high duty cycle.

Following the 2 step increase following time T1, a second DCM sequence is started at time T2 and stopped at time T3. During the second DCM sequence between times T2 and T3, second DCM results are determined. The DCM results from the second DCM sequence are OP[3:2]=00. As previously described, the 00 results indicate that the high duty cycle for both conditions for the DCM is less than 50%. The second DCM results are evaluated and opcodes for setting the DCA circuit are changed to cause an increase in the high duty cycle of internal clocks. As shown in FIG. 10, the DCA circuit is adjusted by the first step size of 2 steps following time T3 to increase the setting of the DCA circuit to +4 and increase the high duty cycle.

A third DCM sequence is performed between times T4 and T5, which results in third DCM results of OP[3:2]=00, indicating that the high duty cycle for both conditions for the DCM is less than 50%. Opcodes for setting the DCA circuit are again changed to cause an increase in the high duty cycle of internal clocks. As shown in FIG. 10, the DCA circuit is adjusted by the first step size of 2 steps following time T5 to increase the setting of the DCA circuit to +6 and further increase the high duty cycle.

A fourth DCM sequence is performed between times T6 and T7, which results in fourth DCM results of OP[3:2]=11. The 11 results indicate that the high duty cycle for both conditions for the DCM is greater than 50%. The change in OP[3:2]=00 at time T5 to an OP[3:2]=11 at time T7 indicates that the adjustment of the DCA circuit to a setting of +6 following time T5 caused the high duty cycle of the internal clocks to increase more than needed. Consequently, the DCA should be adjusted to decrease the setting from +6 to reduce the high duty cycle of the internal clocks. As shown in FIG. 10, the DCA circuit is adjusted by a second step size that is less than the first step size, for example, 1 step, following time T7 to reduce the setting of the DCA circuit to +5 and decrease the high duty cycle.

The second step size may be used to adjust the setting of the DCA circuit more finely than adjusting the setting by the first step size. The second step size may be used, for example, following a change in the DCM results from indicating that the high duty cycle is less than 50% to indicating that the high duty cycle is greater than 50%. The second step size may alternatively or additionally be used based on the history of DCM results. For example, decreasing the settings for the DCA circuit following time T7 by the first step, that is, 2 steps, would result in a DCA circuit setting of +4, which based on the DCM results from the DCM sequence between times T4 and T5, is known to be OP[3:2]=00. The DCM results of OP[3:2]=00 indicate that the high duty cycle for both conditions for the DCM is less than 50%. Thus, adjusting the settings for the DCA circuit by the second step following time T7 results in a DCA circuit setting of +5 that has not yet been evaluated (as DCA circuit settings of +4 and +6 already have).

Following the adjustment of the DCA circuit to a setting of +5, a fifth DCM sequence may be performed between times T8 and T9, which results in fifth DCM results that are indeterminate, that is, of OP[3:2]=10 or OP[3:2]=01. Indeterminate DCM results indicate that the DCM results for each of the two conditions tested during the DCM sequence are different, one DCM result indicating a high duty cycle of greater than 50% and the other DCM result indicating a high duty cycle of less than 50%. Based on the history of DCM results, further adjustments to the DCA circuit settings from +5 would result in conditions that have already been evaluated as needing DCA circuit adjustment (e.g., OP[3:2]=00 for a +4 setting and OP[3:2]=11 for a +6 setting). Consequently, the current +5 DCA setting results in an acceptable (e.g., a least unsatisfactory) setting for the DCA circuit.

In some embodiments of the disclosure, the fifth DCM sequence is not performed. The fifth DCM sequence may be deemed, for example, by a memory controller, unnecessary based on a history of the DCM results. In particular, DCA circuit settings of +4 and +6 were unsatisfactory and resulted in adjustments of the DCA circuit settings. Thus, by deduction, a DCA setting of +5 results in a least unsatisfactory setting for the DCA circuit.

Figure 11:
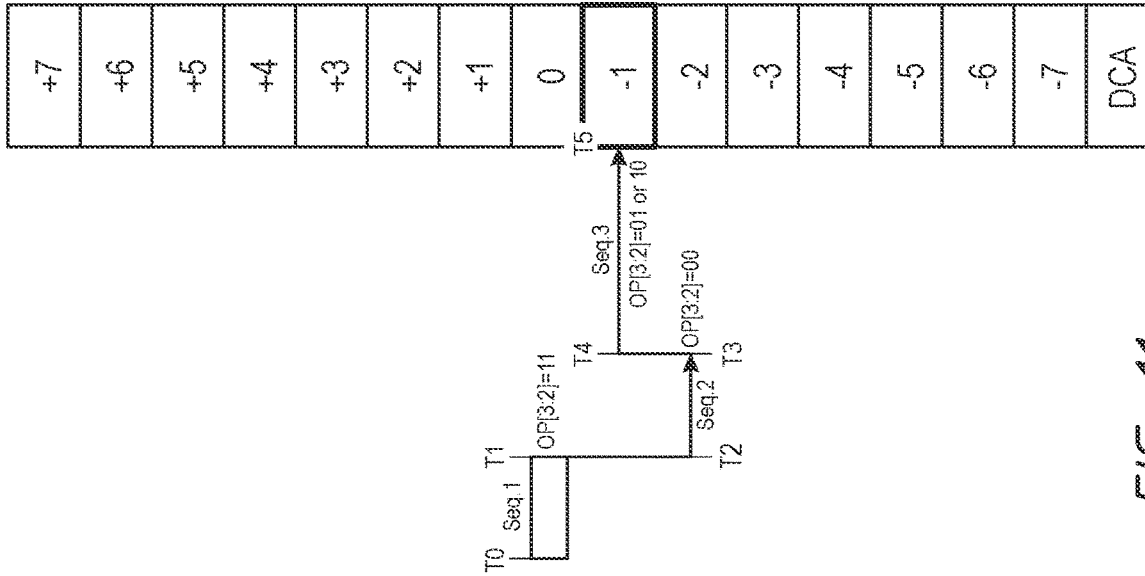
FIG. 11 is a diagram of an operation for setting a DCA circuit according to an embodiment of the disclosure.

FIG. 11 is a diagram of an operation for setting a duty cycle adjuster (DCA) circuit according to an embodiment of the disclosure. The DCA circuit of the example operation of FIG. 11 is considered to not have any DCM offset. That is, the DCA circuit does not include a range of measurement error resulting from circuit variation and mismatch.

Prior to time T0, the DCA circuit is set to an adjustment of 0, for example, following an initialization of the DCA circuit. At time T0 a first DCM sequence is started and at time T1 the first DCM sequence is stopped, for example, by a memory controller issuing appropriate commands to a memory. During the first DCM sequence between times T0 and T1, first DCM results are determined. As previously described, a DCM sequence of the example operation of FIG. 11 provides two DCM results, each corresponding to a different condition for the DCM, for example, with no DCM flip and with DCM flip. The two DCM results will be described as corresponding to opcodes OP[3:2] of a mode register. In the example operation of FIG. 11, the DCM results from the first DCM sequence are OP[3:2]=11. The 11 results indicate in the example operation of FIG. 11 that the high duty cycle for both conditions is greater than 50%. The first DCM results are evaluated by a memory controller, for example, and commands are issued so that opcodes for setting the DCA circuit are changed by the memory controller to cause a decrease in the high duty cycle of internal clocks. As shown in FIG. 11, the DCA circuit is adjusted by a first step size, for example, 2 steps, following time T1 to decrease the setting of the DCA circuit to −2 and decrease the high duty cycle.

Following the 2 step decrease following time T1, a second DCM sequence is started at time T2 and stopped at time T3. During the second DCM sequence between times T2 and T3, second DCM results are determined. The DCM results from the second DCM sequence are OP[3:2]=00. As previously described, the 00 results indicate that the high duty cycle for both conditions for the DCM is less than 50%. The second DCM results are evaluated and opcodes for setting the DCA circuit are changed to cause an increase in the high duty cycle of internal clocks. As shown in FIG. 11, the DCA circuit is adjusted by a second step size that is less than the first step size, for example, 1 step, following time T3 to increase the setting of the DCA circuit from −2 to −1 and increase the high duty cycle.

As previously described with reference to the example operation of FIG. 10, the second step size may be used to adjust the setting of the DCA circuit more finely than adjusting the setting by the first step size. The second step size may be used, for example, following the change in the DCM results from indicating that the high duty cycle is greater than 50% to indicating that the high duty cycle is less than 50%. The second step size may alternatively or additionally be used based on the history of DCM results. For example, increasing the settings for the DCA circuit following time T3 by the first step, that is, 2 steps, would result in a DCA circuit setting of 0, which based on the DCM results from the DCM sequence between times T0 and T1, is known to be OP[3:2]=11. The DCM results of OP[3:2]=11 indicate that the high duty cycle for both conditions for the DCM is greater than 50%. Thus, adjusting the settings for the DCA circuit by the second step following time T3 results in a DCA circuit setting of −1 that has not yet been evaluated (as DCA circuit settings of 0 and −2 already have).

Following the adjustment of the DCA circuit to a setting of −1, a third DCM sequence may be performed between times T4 and T5, which results in third DCM results that are indeterminate, that is, of OP[3:2]=10 or OP[3:2]=01. As previously described, indeterminate DCM results indicate that the DCM results for each of the two conditions tested during the DCM sequence are different, one DCM result indicating a high duty cycle of greater than 50% and the other DCM result indicating a high duty cycle of less than 50%. Based on the history of DCM results, further adjustments to the DCA circuit settings from −1 would result in conditions that have already been evaluated as needing DCA circuit adjustment (e.g., OP[3:2]=11 for a 0 setting and OP[3:2]=00 for a −2 setting). Consequently, the current −1 DCA setting results in an acceptable setting for the DCA circuit.

In some embodiments of the disclosure, the third DCM sequence is not performed. The third DCM sequence may be deemed, for example, by a memory controller, unnecessary based on a history of the DCM results. In particular, DCA circuit settings of 0 and −2 were unsatisfactory and resulted in adjustments of the DCA circuit settings. Thus, by deduction, a DCA setting of −1 results in a least unsatisfactory setting for the DCA circuit.

Figure 12:
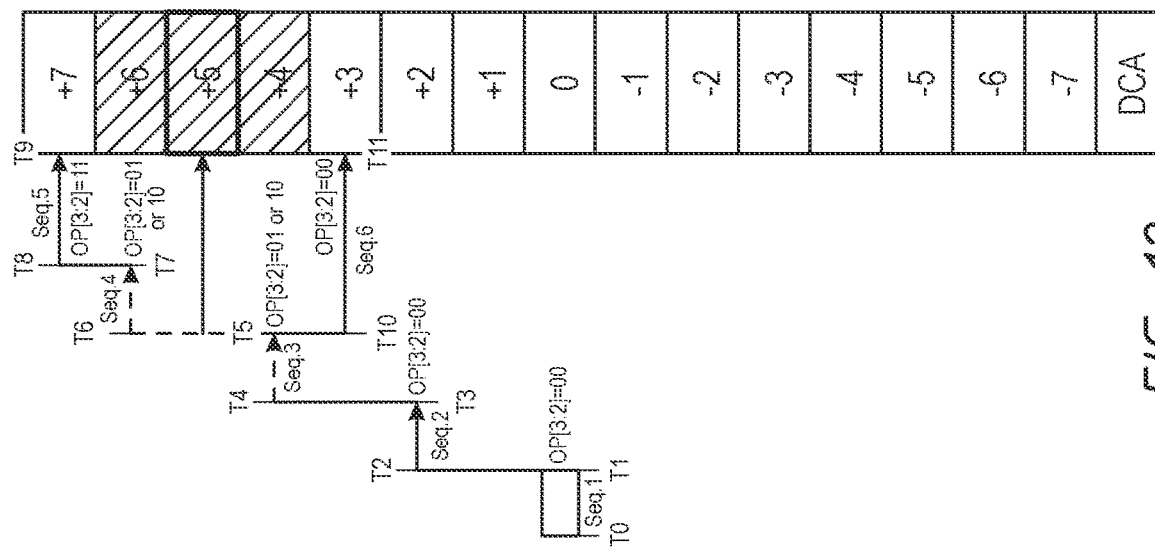
FIG. 12 is a diagram of an operation for setting a DCA circuit according to an embodiment of the disclosure.

FIG. 12 is a diagram of an operation for setting a duty cycle adjuster (DCA) circuit according to an embodiment of the disclosure. The DCA circuit of the example operation of FIG. 12 is considered to have a DCM offset. That is, the DCA circuit includes a range of measurement error resulting from circuit variation and mismatch. In the example operation of FIG. 12, the DCM offset is over a range of about 2-3 steps of DCA settings.

Prior to time T0, the DCA circuit is set to an adjustment of 0, for example, following an initialization of the DCA circuit. At time T0 a first DCM sequence is started and at time T1 the first DCM sequence is stopped, for example, by a memory controller issuing appropriate commands to a memory. During the first DCM sequence between times T0 and T1, first DCM results are determined. The DCM results from the first DCM sequence are OP[3:2]=00, indicating that the high duty cycle for both conditions is less than 50%. The first DCM results are evaluated by a memory controller, for example, and commands are issued so that opcodes for setting the DCA circuit are changed by the memory controller to cause an increase in the high duty cycle of internal clocks. As shown in FIG. 12, the DCA circuit is adjusted by a first step size, for example, 2 steps, following time T1 to increase the setting of the DCA circuit to +2 and increase the high duty cycle.

Following the 2 step increase following time T1, a second DCM sequence is started at time T2 and stopped at time T3. During the second DCM sequence between times T2 and T3, second DCM results are determined. The DCM results from the second DCM sequence are OP[3:2]=00. As previously described, the 00 results indicate that the high duty cycle for both conditions for the DCM is less than 50%. The second DCM results are evaluated and opcodes for setting the DCA circuit are changed to cause an increase in the high duty cycle of internal clocks. As shown in FIG. 12, the DCA circuit is adjusted by the first step size of 2 steps following time T3 to increase the setting of the DCA circuit to +4 and increase the high duty cycle.

A third DCM sequence is performed between times T4 and T5, which result in third DCM results that are indeterminate, that is, of OP[3:2]=10 or OP[3:2]=01. As previously described, indeterminate DCM results indicate that the DCM results for each of the two conditions tested during the DCM sequence are different, one DCM result indicating a high duty cycle of greater than 50% and the other DCM result indicating a high duty cycle of less than 50%. Given that the DCM results are indeterminate, and an overshoot in the DCA settings has not resulted in a definite change from the previous DCM results OP[3:2]=00 from the DCM sequence between times T2 and T3, the indeterminate DCM results from the DCM sequence between times T4 and T5 is considered to be a setting within a range of error for the DCM, that is, within the DCM offset of the DCM.

Boundaries of the DCM offset range are determined by performing DCM sequences for different DCA circuit settings to identify the settings resulting in determinate DCM results that border DCA circuit settings that result in indeterminate DCM results. The boundaries of the DCM offset are represented by the maximum DCA circuit setting that results in DCM results that are indeterminate (e.g., upper boundary) and the minimum DCA circuit setting that results in DCM results that are indeterminate (e.g., lower boundary). The DCA code for the determinate DCM results that borders the upper boundary of the DCM offset is one step greater than the DCA code for the indeterminate DCA results representing the upper boundary, and the DCA code for the determinate DCM results that borders the lower boundary of the DCM offset is one step less than the DCA code for the indeterminate DCA results representing the lower boundary.

For example, following the indeterminate DCM results following time T5 from the DCA circuit setting of +4, the setting for the DCA circuit is adjusted by the first step size of 2 steps to continue increasing the DCA circuit setting. The resulting DCA circuit setting is +6. A fourth DCM sequence is performed between times T6 and T7. The resulting fourth DCM results are again indeterminate, which indicate that the DCA circuit setting of +6 is within the range of the DCM offset. The DCA circuit setting is further increased following time T7 to find a boundary of the DCM offset. With the DCA circuit setting already at +6, and a maximum DCA circuit setting of +7, the DCA circuit setting is adjusted by 1 step to increase the DCA circuit setting to +7.

A fifth DCM sequence is performed between times T8 and T9, which results in fifth DCM results of OP[3:2]=11. The fifth DCM results are determinate, and indicate that the high duty cycle for both conditions for the DCM is greater than 50%. With the DCA circuit settings of +7 resulting in determinate DCM results, and indicating that the high duty cycle is greater than 50% for both conditions, and further with the DCA circuit settings of +6 resulting in indeterminate DCM results, it can be concluded that the DCA circuit setting of +6 represents an upper boundary of the DCM offset. The lower boundary of the DCM offset remains to be determined.

To determine the lower boundary of the DCM offset, the DCA circuit setting is adjusted relative to the DCA setting of +4, which as previously described, resulted in indeterminate DCM results from the DCM sequence between times T4 to T5. With the DCA circuit setting of +4 resulting in indeterminate DCM results, and searching for a lower boundary of the DCM offset, the DCA circuit settings are adjusted to decrease a high duty cycle. The DCA settings are adjusted by a second step size that is less than the first step size, for example, 1 step, to reduce the setting of the DCA circuit from +4 to +3.

The second step size of 1 step may be used to adjust the DCA circuit settings because, for example, there is a change in direction of adjustment for the DCA circuit setting relative to the direction of adjustment that resulted in the indeterminate DCM results. As previously described, the direction of adjustment that resulted in the indeterminate DCM results from the DCA circuit setting of +4 was increasing the high duty cycle (i.e., an adjustment of a 2 step increase from a DCA circuit setting of +2 to +4 following time T3). With now adjusting the DCA circuit settings to decrease the high duty cycle in order to find a lower boundary of the DCM offset, the direction of adjustment is changed to the minus direction. The second step size may alternatively or additionally be used based on the history of DCM results. For example, decreasing the settings for the DCA circuit following time T5 by the first step, that is, 2 steps, would result in a DCA circuit setting of +2, which based on the DCM results from the DCM sequence between times T2 and T3, is known to be OP[3:2]=00. The DCM results of OP[3:2]=00 indicate that the high duty cycle for both conditions for the DCM is less than 50%. Thus, adjusting the settings for the DCA circuit by the second step following time T5 results in a DCA circuit setting of +3 that has not yet been evaluated (as DCA circuit settings of +2 already has). Consequently, the second step size is used to decrease the DCA circuit setting from +4 to +3.

A sixth DCM sequence is performed between times T10 and T11 following the adjustment of the DCA circuit setting to +3, which result in sixth DCM results of OP[3:2]=00. The sixth DCM results are determinate, and indicate that the high duty cycle for both conditions for the DCM is less than 50%. With the DCA circuit settings of +3 resulting in determinate DCM results, and indicating that the high duty cycle is less than 50% for both conditions, and further with the DCA circuit settings of +4 resulting in indeterminate DCM results, it can be concluded that the DCA circuit setting of +4 represents a lower boundary of the DCM offset.

Thus, in the example operation of FIG. 12, the boundaries for the DCM offset are determined to be the DCA circuit settings of +4 and +6.

A DCA circuit setting that is within the boundaries of the DCM offset may result in an acceptable setting for the DCA circuit. For example, an intermediate DCA circuit setting that is midway (or close to midway) between the boundaries of the DCM offset may result in a least unsatisfactory setting for the DCA circuit. With reference to the example operation of FIG. 12, the DCA circuit setting of +5 is an intermediate DCA circuit setting that is midway between the DCM offset boundaries of +4 and +6. The DCA circuit setting of +5 may provide an acceptable setting for the DCA circuit.

Figure 13:
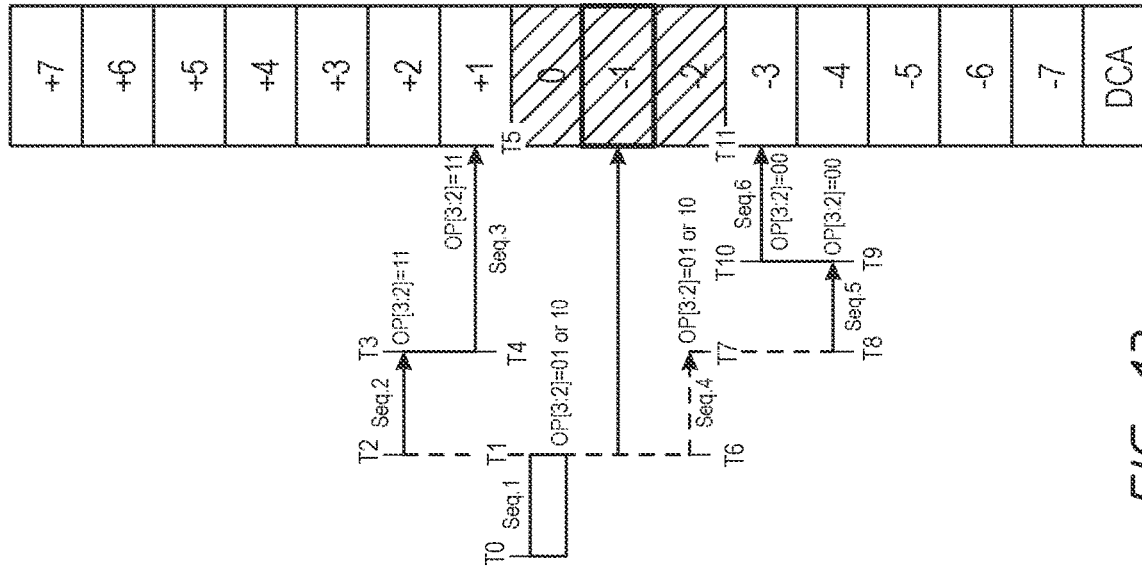
FIG. 13 is a diagram of an operation for setting a DCA circuit according to an embodiment of the disclosure.

FIG. 13 is a diagram of an operation for setting a duty cycle adjuster (DCA) circuit according to an embodiment of the disclosure. The DCA circuit of the example operation of FIG. 13 is considered to have a DCM offset. That is, the DCA circuit includes a range of measurement error resulting from circuit variation and mismatch. In the example operation of FIG. 13, the DCM offset is over a range of about 2-3 steps of DCA settings.

Prior to time T0, the DCA circuit is set to an adjustment of 0, for example, following an initialization of the DCA circuit. At time T0 a first DCM sequence is started and at time T1 the first DCM sequence is stopped. During the first DCM sequence between times T0 and T1, first DCM results are determined. The DCM results from the first DCM sequence are indeterminate. Given that the DCM results are indeterminate, and there have not been any DCA circuit settings that have resulted in determinate DCM results, the DCA circuit setting that resulted in the indeterminate DCM results from the DCM sequence between times T0 and T1 are considered within a range of error for the DCM, that is, within the DCM offset of the DCM.

As previously described, boundaries of the DCM offset range are determined by performing DCM sequences for different DCA circuit settings to identify the settings resulting in determinate DCM results that border DCA circuit settings that result in indeterminate DCM results. The boundaries of the DCM offset are represented by the maximum DCA circuit setting that results in DCM results that are indeterminate (e.g., upper boundary) and the minimum DCA circuit setting that results in DCM results that are indeterminate (e.g., lower boundary).

For example, following the indeterminate DCM results following time T1 from the DCA circuit setting of 0, the setting for the DCA circuit is adjusted by a first step size of 2 steps. In the example operation of FIG. 13, the DCA circuit setting is increased by the first step size to +2. However, in other embodiments of the disclosure, the DCA circuit setting may be decreased by the first step size when an initial DCA circuit setting is within a DCM offset.

A second DCM sequence is performed between times T2 and T3 for the DCA circuit setting of +2 to determine second DCM results. The second DCM results are OP[3:2]=11. As previously described, the 11 DCM results indicate that the high duty cycle for both conditions for the DCM is greater than 50%. The second DCM results are evaluated and opcodes for setting the DCA circuit are changed to cause a decrease in the high duty cycle. As shown in FIG. 13, the DCA circuit setting is adjusted by a second step size that is less than the first step size, for example, 1 step, following time T3 to reduce the setting of the DCA circuit from +2 to +1 and decrease the high duty cycle.

The second step size of 1 step may be used to adjust the DCA circuit settings because, for example, there is a change in direction of adjustment for the DCA circuit setting relative to the previous direction of adjustment. As previously described, the direction of adjustment that resulted in the DCM results OP[3:2]=11 for the DCA circuit setting of +2 was increasing the high duty cycle (i.e., an adjustment of a 2 step increase from a DCA circuit setting of 0 to +2 following time T1). With now adjusting the DCA circuit settings to decrease the high duty cycle, the direction of adjustment is changed to the minus direction. Consequently, the second step size is used to adjust the DCA circuit setting from +2 to +1. The second step size may alternatively or additionally be used based on the history of DCM results. For example, decreasing the settings for the DCA circuit following time T3 by the first step, that is, 2 steps, would result in a DCA circuit setting of 0, which based on the DCM results from the DCM sequence between times T0 and T1, is known to be indeterminate. Thus, adjusting the settings for the DCA circuit by the second step following time T3 results in a DCA circuit setting of +1 that has not yet been evaluated by a DCM sequence (as DCA circuit settings of 0 already has).

A third DCM sequence may be performed between times T4 and T5 for the DCA circuit setting of +1, which results in third DCM results of OP[3:2]=11. The third DCM results are determinate, and indicate that the high duty cycle for both conditions for the DCM is greater than 50%. With the DCA circuit settings of +1 resulting in determinate DCM results, and indicating that the high duty cycle is greater than 50% for both conditions, and further with the DCA circuit settings of 0 resulting in indeterminate DCM results, it can be concluded that the DCA circuit setting of 0 represents an upper boundary of the DCM offset. The lower boundary of the DCM offset remains to be determined.

To determine the lower boundary of the DCM offset, the DCA circuit setting is adjusted relative to the DCA setting of 0, which as previously described, resulted in indeterminate DCM results from the DCM sequence between times T0 to T1. With the DCA circuit setting of 0 resulting in indeterminate DCM results, and searching for a lower boundary of the DCM offset, the DCA circuit settings are adjusted to decrease a high duty cycle. The DCA settings are adjusted by the first step size to reduce the setting of the DCA circuit from 0 to −2. The first step size of 2 steps may be used because there are no DCM results for decreasing adjustments of the DCA circuit settings.

A fourth DCM sequence is performed between times T6 and T7. The resulting fourth DCM results are indeterminate, which indicate that the DCA circuit setting of −2 is within the range of the DCM offset. The DCA circuit setting is decreased again following time T7 to find a lower boundary of the DCM offset. Following the indeterminate DCM results following time T7 from the DCA circuit setting of −2, the setting for the DCA circuit is adjusted by the first step size of 2 steps to continue decreasing the DCA circuit setting. The resulting DCA circuit setting is −4. A fifth DCM sequence is performed between times T8 and T9. The resulting fifth DCM results are OP[3:2]=00, which indicate that the high duty cycle for both conditions for the DCM is less than 50%. The fifth DCM results are evaluated and opcodes for the DCA circuit setting are changed to cause an increase in the high duty cycle. As shown in FIG. 13, the DCA circuit is adjusted by the second step size of 1 step following time T9 to increase the setting of the DCA circuit from −4 to −3 and increase the high duty cycle.

The second step size may be used to adjust the DCA circuit settings to −3, for example, following the change in direction of adjustment for the DCA circuit setting relative to the direction of adjustment that resulted in the previous DCM results. As previously described, the direction of adjustment that resulted in the DCM results for the DCA circuit setting of −4 was decreasing the high duty cycle (i.e., an adjustment of −2 from a DCA circuit setting of −2 to −4 following time T7). With now adjusting the DCA circuit settings to increase the high duty cycle in order to find a lower boundary of the DCM offset, the direction of adjustment is changed to the plus direction. Consequently, the second step size is used to adjust the DCA circuit setting from −4 to −3.

The second step size may alternatively or additionally be used based on the history of DCM results. For example, increasing the settings for the DCA circuit following time T9 by the first step, that is, 2 steps, would result in a DCA circuit setting of −2, which based on the DCM results from the DCM sequence between times T6 and T7, is known to be indeterminate. The DCM results of OP[3:2]=00 indicate that the high duty cycle for both conditions for the DCM is less than 50%. Thus, adjusting the settings for the DCA circuit by the second step following time T9 results in a DCA circuit setting of −3 that has not yet been evaluated by a DCM sequence (as DCA circuit settings of −2 already has).

A sixth DCM sequence is performed between times T10 and T11 following the adjustment of the DCA circuit setting to −3, which result in sixth DCM results in DCM results of OP[3:2]=00. The sixth DCM results are determinate, and indicate that the high duty cycle for both conditions for the DCM is less than 50%. With the DCA circuit settings of −3 resulting in determinate DCM results, and indicating that the high duty cycle is less than 50% for both conditions, and further with the DCA circuit settings of −2 resulting in indeterminate DCM results from the DCM sequence between times T6 and T7, it can be concluded that the DCA circuit setting of −2 represents a lower boundary of the DCM offset.

This, in the example operation of FIG. 13, the boundaries for the DCM offset are determined to be the DCA circuit settings of 0 and −2.

As previously described with reference to FIG. 12, a DCA circuit setting that is within the boundaries of the DCM offset may result in an acceptable setting for the DCA circuit. An intermediate DCA circuit setting that is midway (or close to midway) between the boundaries of the DCM offset may result in a least unsatisfactory setting for the DCA circuit. With reference to the example operation of FIG. 13, the DCA circuit setting of −1 is an intermediate DCA circuit setting that is midway between the DCM offset boundaries of 0 and −2. The DCA circuit setting of −3 may provide an acceptable setting for the DCA circuit.

In contrast to the example operations of FIGS. 10 and 11, the example operations of FIGS. 12 and 13 include identifying DCA circuit settings representing boundaries of a DCM offset. For the example operations of FIGS. 10 and 11, it was assumed that there was no DCM offset, and as a result, identifying the boundaries of a DCM offset was unnecessary. Based on the boundary DCA circuit settings, an intermediate DCA circuit setting between the boundary DCA circuit settings is used to set the DCA circuit. The example operations of FIGS. 10-13 may be combined partially or wholly to provide alternative embodiments of the disclosure.

FIG. 14 is a diagram of an operation for setting a duty cycle adjuster (DCA) circuit according to an embodiment of the disclosure. The DCA circuit of the example operation of FIG. 14 is considered to have a DCM offset. That is, the DCA circuit includes a range of measurement error resulting from circuit variation and mismatch. In the example operation of FIG. 14, the DCM offset is over a range of about 6 steps of DCA settings.

Prior to time T0, the DCA circuit is set to an adjustment of 0, for example, following an initialization of the DCA circuit. At time T0 a first DCM sequence is started and at time T1 the first DCM sequence is stopped. During the first DCM sequence between times T0 and T1, first DCM results are determined. The DCM results from the first DCM sequence are OP[3:2]=00, indicating that the high duty cycle for both conditions is less than 50%. The first DCM results are evaluated and opcodes for setting the DCA circuit are changed to cause an increase in the high duty cycle of internal clocks. As shown in FIG. 14, the DCA circuit is adjusted by a first step size, for example, 2 steps, following time T1 to increase the setting of the DCA circuit to +2 and increase the high duty cycle.

Following the 2 step increase to a DCA circuit setting of +2 following time T1, a second DCM sequence is started at time T2 and stopped at time T3. During the second DCM sequence between times T2 and T3, second DCM results are determined. The DCM results from the second DCM sequence are indeterminate. Given that the DCM results are indeterminate, and an overshoot in the DCA settings has not resulted in a definite change from the previous DCM results OP[3:2]=00 from the DCM sequence between times T0 and T1, the indeterminate DCM results from the DCM sequence between times T2 and T3 is considered within a range of error for the DCM, that is, within the DCM offset of the DCM.

Following the indeterminate DCM results following time T3 from the DCA circuit setting of +2, the setting for the DCA circuit is adjusted by the first step size of 2 steps to continue increasing the DCA circuit setting. The resulting DCA circuit setting is +4. A third DCM sequence is performed between times T4 and T5. The resulting third DCM results are indeterminate, which indicate that the DCA circuit setting of +4 is still within the range of the DCM offset. The DCA circuit setting is increased again following time T5 by the first step size of 2 steps to continue increasing the DCA circuit setting. The resulting DCA circuit setting is +6. A fourth DCM sequence is performed between times T6 and T7. The resulting fourth DCM results are again indeterminate, which indicate that the DCA circuit setting of +6 is still within the range of the DCM offset. The DCA circuit setting is increased again following time T7 to find a boundary of the DCM offset. With the DCA circuit setting already at +6, and a maximum DCA circuit setting of +7, the DCA circuit setting is adjusted by 1 step to increase the DCA circuit setting to +7.

A fifth DCM sequence is performed between times T8 and T9, which results in fifth DCM results of OP[3:2]=11. The fifth DCM results are determinate, and indicate that the high duty cycle for both conditions for the DCM is greater than 50%. With the DCA circuit settings of +7 resulting in determinate DCM results, and indicating that the high duty cycle is greater than 50% for both conditions, and further with the DCA circuit settings of +6 resulting in indeterminate DCM results, it can be concluded that the DCA circuit setting of +6 represents an upper boundary of the DCM offset. The lower boundary of the DCM offset remains to be determined.

To determine the lower boundary of the DCM offset, the DCA circuit setting is adjusted relative to the DCA setting of +2, which as previously described, resulted in indeterminate DCM results from the DCM sequence between times T2 to T3. With the DCA circuit setting of +2 resulting in indeterminate DCM results, and searching for a lower boundary of the DCM offset, the DCA circuit settings are adjusted to decrease a high duty cycle. The DCA settings are adjusted by a second step size that is less than the first step size, for example, 1 step, to reduce the setting of the DCA circuit from +2 to +1.

The second step size of 1 step may be used to adjust the DCA circuit settings because, for example, there is a change in direction of adjustment for the DCA circuit setting relative to the direction of adjustment that resulted in the indeterminate DCM results. As previously described, the direction of adjustment that resulted in the indeterminate DCM results from the DCA circuit setting of +2 was increasing the high duty cycle (i.e., an adjustment of a 2 step increase from a DCA circuit setting of 0 to +2 following time T1). With now adjusting the DCA circuit settings to decrease the high duty cycle in order to find a lower boundary of the DCM offset, the direction of adjustment is changed to the minus direction. Consequently, the second step size is used to adjust the DCA circuit setting from +2 to +1.

The second step size of 1 step may alternatively or additionally be used based on the history of DCM results. For example, decreasing the settings for the DCA circuit following time T9 by the first step, that is, 2 steps, would result in a DCA circuit setting of 0, which based on the DCM results from the DCM sequence between times T0 and T1, is known to be OP[3:2]=00. The DCM results of OP[3:2]=00 indicate that the high duty cycle for both conditions for the DCM is less than 50%. Thus, adjusting the settings for the DCA circuit by the second step following time T9 results in a DCA circuit setting of +1 that has not yet been evaluated by a DCM sequence (as DCA circuit settings of 0 already has).

A sixth DCM sequence is performed between times T10 and T11 following the adjustment of the DCA circuit setting to +1, which result in sixth DCM results that are indeterminate. With the DCA circuit settings of +1 resulting in indeterminate DCM results, and further with the DCA circuit settings of 0 resulting in determinate DCM results of OP[3:2]=00, it can be concluded that the DCA circuit setting of +1 represents a lower boundary of the DCM offset.

Thus, in the example operation of FIG. 14, the boundaries for the DCM offset are determined to be the DCA circuit settings of +1 and +6.

As previously described with reference to FIGS. 12 and 13, a DCA circuit setting that is within the boundaries of the DCM offset may result in an acceptable setting for the DCA circuit. For example, an intermediate DCA circuit setting that is midway (or close to midway) between the boundaries of the DCM offset may result in a least unsatisfactory setting for the DCA circuit. With reference to the example operation of FIG. 14, the DCM offset between +1 and +6 include an even number of DCA circuit settings, namely, 6 steps. As a result, no one DCA circuit setting is midway between the boundaries of the DCM offset. However, both DCA circuit settings of +3 and +4 are intermediate DCA circuit settings that are close to midway between the boundaries of +1 and +6 of the DCM offset. Thus, a DCA circuit setting of +3 or +4 may provide an acceptable setting for the DCA circuit.

The choice between two intermediate DCA circuit settings in a DCM offset may be based on, for example, a preference for a resulting internal clock signal to have a high duty cycle of greater than 50% or to have a high duty cycle of less than 50%. The choice between two intermediate DCA circuits settings in a DCM offset may be based on alternative and/or additional considerations without departing from the scope of the disclosure. In a specific example operation of FIG. 14, the DCA circuit is set to +3. However, setting the DCA circuit to a lower setting of two intermediate DCA circuit settings, or to the DCA circuit setting that is closer to a 0 setting is not intended to limit the scope of the disclosure.

FIG. 15 is a diagram of an operation for setting a duty cycle adjuster (DCA) circuit according to an embodiment of the disclosure. The DCA circuit of the example operation of FIG. 15 is considered to have a DCM offset. That is, the DCA circuit includes a range of measurement error resulting from circuit variation and mismatch. In the example operation of FIG. 15, the DCM offset is over a range of about 6 steps of DCA settings.

Prior to time T0, the DCA circuit is set to an adjustment of 0, for example, following an initialization of the DCA circuit. At time T0 a first DCM sequence is started and at time T1 the first DCM sequence is stopped. During the first DCM sequence between times T0 and T1, first DCM results are determined. The DCM results from the first DCM sequence are indeterminate. Given that the DCM results are indeterminate, and there have not been any DCA circuit settings that have resulted in determinate DCM results, the DCA circuit setting that resulted in the indeterminate DCM results from the DCM sequence between times T0 and T1 are considered within a range of error for the DCM, that is, within the DCM offset of the DCM.

Following the indeterminate DCM results following time T1 from the DCA circuit setting of 0, the setting for the DCA circuit is adjusted by a first step size of 2 steps. In the example operation of FIG. 15, the DCA circuit setting is increased by the first step size to +2. However, in other embodiments of the disclosure, the DCA circuit setting may be decreased by the first step size when an initial DCA circuit setting is within a DCM offset.

A second DCM sequence is performed between times T2 and T3 for the DCA circuit setting of +2 to determine second DCM results. The second DCM results are OP[3:2]=11. As previously described, the 11 DCM results indicate that the high duty cycle for both conditions for the DCM is greater than 50%. The second DCM results are evaluated and opcodes for setting the DCA circuit are changed to cause a decrease in the high duty cycle. As shown in FIG. 15, the DCA circuit setting is adjusted by a second step size that is less than the first step size, for example, 1 step, following time T3 to reduce the setting of the DCA circuit from +2 to +1, and decrease the high duty cycle.

The second step size of 1 step may be used to adjust the DCA circuit settings because, for example, there is a change in direction of adjustment for the DCA circuit setting relative to the previous direction of adjustment. As previously described, the direction of adjustment that resulted in the DCM results OP[3:2]=11 for the DCA circuit setting of +2 was increasing the high duty cycle (i.e., an adjustment of a 2 step increase from a DCA circuit setting of 0 to +2 following time T1). With now adjusting the DCA circuit settings to decrease the high duty cycle, the direction of adjustment is changed to the minus direction. Consequently, the second step size is used to adjust the DCA circuit setting from +2 to +1. The second step size may alternatively or additionally be used based on the history of DCM results. For example, decreasing the settings for the DCA circuit following time T3 by the first step, that is, 2 steps, would result in a DCA circuit setting of 0, which based on the DCM results from the DCM sequence between times T0 and T1, is known to be indeterminate. Thus, adjusting the settings for the DCA circuit by the second step following time T3 results in a DCA circuit setting of +1 that has not yet been evaluated by a DCM sequence (as DCA circuit settings of 0 already has).

A third DCM sequence may be performed between times T4 and T5 for the DCA circuit setting of +1, which results in third DCM results that are indeterminate. With the DCA circuit settings of +1 resulting in indeterminate DCM results, and further with the DCA circuit settings of +2 resulting in determinate DCM results of OP[3:2]=11, it can be concluded that the DCA circuit setting of +1 represents an upper boundary of the DCM offset. The lower boundary of the DCM offset remains to be determined.

To determine the lower boundary of the DCM offset, the DCA circuit setting is adjusted relative to the DCA setting of 0, which as previously described, resulted in indeterminate DCM results from the DCM sequence between times T0 to T1. With the DCA circuit setting of 0 resulting in indeterminate DCM results, and searching for a lower boundary of the DCM offset, the DCA circuit settings are adjusted to decrease a high duty cycle. The DCA settings are adjusted by the first step size to reduce the setting of the DCA circuit from 0 to −2. The first step size of 2 steps may be used because there are no DCM results for decreasing adjustments of the DCA circuit settings.

A fourth DCM sequence is performed between times T6 and T7. The resulting fourth DCM results are indeterminate, which indicate that the DCA circuit setting of −2 is within the range of the DCM offset. The DCA circuit setting is decreased again following time T7 to find a lower boundary of the DCM offset. Following the indeterminate DCM results following time T7 from the DCA circuit setting of −2, the setting for the DCA circuit is adjusted by the first step size of 2 steps to continue decreasing the DCA circuit setting. The resulting DCA circuit setting is −4. A fifth DCM sequence is performed between times T8 and T9. The resulting fifth DCM results are also indeterminate, which indicates that the DCA circuit setting of −4 is still within the range of the DCM offset. Following the indeterminate DCM results following time T9 from the DCA circuit setting of −4, the setting for the DCA circuit is adjusted by the first step size of 2 steps to continue decreasing the DCA circuit setting. The resulting DCA circuit setting is −6.

A sixth DCM sequence is performed between times T10 and T11. The resulting fifth DCM results are OP[3:2]=00, which indicate that the high duty cycle for both conditions for the DCM is less than 50%. The sixth DCM results are evaluated and opcodes for the DCA circuit setting are changed to cause an increase in the high duty cycle. As shown in FIG. 15, the DCA circuit is adjusted by the second step size of 1 step following time T9 to increase the setting of the DCA circuit from −6 to −5 and increase the high duty cycle.

The second step size may be used to adjust the DCA circuit settings to −5, for example, following the change in direction of adjustment for the DCA circuit setting relative to the direction of adjustment that resulted in the previous DCM results. As previously described, the direction of adjustment that resulted in the DCM results for the DCA circuit setting of −6 was decreasing the high duty cycle (i.e., an adjustment of a 2 step decrease from a DCA circuit setting of −4 to −6 following time T9). With now adjusting the DCA circuit settings to increase the high duty cycle in order to find a lower boundary of the DCM offset, the direction of adjustment is changed to the plus direction. Consequently, the second step size is used to adjust the DCA circuit setting from −6 to −5.

The second step size may alternatively or additionally be used based on the history of DCM results. For example, increasing the settings for the DCA circuit following time T11 by the first step, that is, 2 steps, would result in a DCA circuit setting of −4, which based on the DCM results from the DCM sequence between times T8 and T9, is known to be indeterminate. The DCM results of OP[3:2]=00 from the DCM sequence between times T10 and T11 indicate that the high duty cycle for both conditions for the DCM is less than 50%. Thus, adjusting the settings for the DCA circuit by the second step following time T11 results in a DCA circuit setting of −5 that has not yet been evaluated by a DCM sequence (as DCA circuit settings of −4 already has).

A seventh DCM sequence is performed between times T12 and T13 following the adjustment of the DCA circuit setting to −5, which result in sixth DCM results in DCM results of OP[3:2]=00. The seventh DCM results are determinate, and indicate that the high duty cycle for both conditions for the DCM is less than 50%. With the DCA circuit settings of −5 resulting in determinate DCM results, and indicating that the high duty cycle is less than 50% for both conditions, and further with the DCA circuit settings of −4 resulting in indeterminate DCM results from the DCM sequence between times T8 and T9, it can be concluded that the DCA circuit setting of −4 represents a lower boundary of the DCM offset.

Thus, in the example operation of FIG. 15, the boundaries for the DCM offset are determined to be the DCA circuit settings of −4 and +1.

As previously described with reference to FIGS. 12-14, a DCA circuit setting that is within the boundaries of the DCM offset may result an acceptable setting for the DCA circuit. An intermediate DCA circuit setting that is midway (or close to midway) between the boundaries of the DCM offset may result in a least unsatisfactory setting for the DCA circuit. With reference to the example operation of FIG. 15, the DCM offset between −4 and +1 include an even number of DCA circuit settings, namely, 6 steps. As a result, no one DCA circuit setting is midway between the boundaries of the DCM offset. However, both DCA circuit settings of −2 and −1 are intermediate DCA circuit settings that are close to midway between the boundaries of −4 to +1 of the DCM offset. Thus, a DCA circuit setting of −2 or −1 may provide an acceptable setting for the DCA circuit.

The choice between two intermediate DCA circuit settings in a DCM offset may be based on, for example, a preference for a resulting internal clock signal to have a high duty cycle of greater than 50% or to have a high duty cycle of less than 50%. The choice between two intermediate DCA circuits settings in a DCM offset may be based on alternative and/or additional considerations without departing from the scope of the disclosure. In a specific example operation of FIG. 15, the DCA circuit is set to −1. However, setting the DCA circuit to a higher setting of two intermediate DCA circuit settings, or to the DCA circuit setting that is closer to a 0 setting is not intended to limit the scope of the disclosure.

In contrast to the example operations of FIGS. 12 and 13, the example operations of FIGS. 14 and 15 include identifying DCA circuit settings representing boundaries of a DCM offset that includes an even number of DCA circuit settings. With reference to FIGS. 12 and 13, it was assumed that the DCM offset included an odd number of DCA settings, and as a result, there was one DCA circuit setting midway between the boundaries of the DCM offset. As a result of having an even number of DCA circuit settings in the DCM offset, no one DCA circuit setting is midway between the boundaries of the DCM offset, but instead two DCA circuit settings are intermediate DCA circuit settings that are close to midway between the boundaries of the DCM offset. One of the two intermediate DCA circuit settings may be selected to set the DCA circuit. Various considerations may be made in selecting which of the two intermediate DCA circuit settings to set. The example operations of FIGS. 10-15 may be combined partially or wholly to provide alternative embodiments of the disclosure.

The example operations of FIGS. 10-15 describe embodiments of the disclosure that include changing the DCA code by multiple step sizes (e.g., more than one step size) and/or identifying a DCM offset in terms of a range of DCA codes to identify a DCA code setting for a DCA circuit. Using multiple step sizes (e.g., fast speed and slow speed) and/or identifying a range of DCA codes for DCM offset may be combined in various manners to provide alternative embodiments of the disclosure. Moreover, embodiments of disclosure described with reference to FIGS. 1-15 may be included in various combinations to provide alternative embodiments of the disclosure.

As previously described, the range of adjustment for the DCA of the operations of FIGS. 10-15 is +7 to −7. However, in some embodiments of the disclosure, the range of DCA adjustment may be greater than +7 to −7. An example of such an embodiment may include a range of DCA adjustment of ±15 to −15. In some embodiments of the disclosure, the range of DCA adjustment may be less than +7 to −7. An example of such an embodiment may include a range of DCA adjustment of +4 to −4. Thus, embodiments of the disclosure are not limited to the particular range of adjustment of +7 to −7 as specifically described for the operations of FIGS. 10-15.

As previously described, multiple step sizes may be used in changing from one DCA code to another. For example, the operations of FIGS. 10-15 were described as including first and second step sizes. However, in some embodiments of the disclosure, a greater number of step sizes may be included. For example, in some embodiments of the disclosure include three step sizes. Although not limited to such, additional step sizes may facilitate identifying an acceptable DCA code where a range of adjustment is greater than +7 to −7 (e.g., +15 to −15). Additionally, the size of the steps may be different than described with reference to the operations of FIGS. 10-15 (e.g., 2 steps and 1 step). For example, some embodiments of the disclosure may include steps sizes of 4 steps and 2 steps. Thus, embodiments of the disclosure are not limited to the particular number of step sizes and sizes of steps previously described for FIGS. 10-15.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method comprising:
writing a first duty cycle code for a duty cycle adjuster to a first mode register;
reading duty cycle results for the first duty cycle code from a second mode register, wherein the duty cycle results indicate a duty cycle condition for a first adjustment to a duty cycle associated with the first duty cycle code; and
writing a second duty cycle code for the duty cycle adjuster to the first mode register when the duty cycle results indicate a change in the duty cycle condition associated with the first duty cycle code and a previous duty cycle code, wherein the second duty cycle code is associated with a second adjustment to the duty cycle, wherein the second adjustment has a different size than the first adjustment.

2. The method of claim 1, wherein the second adjustment is smaller than the first adjustment.

3. The method of claim 1, wherein the first duty cycle code comprises a first code for an upper byte of data and a second code for a lower byte of data.

4. The method of claim 1, wherein the duty cycle results comprise a first result for an upper byte of data and a second result for a lower byte of data.

5. The method of claim 1, further comprising writing a first value to the second mode register, wherein the first value causes a duty cycle monitor to monitor the duty cycle and generate the duty cycle results.

6. The method of claim 5, further comprising writing a second value to the second mode register, wherein the second value causes the duty cycle monitor to stop monitoring the duty cycle.

7. The method of 1, wherein the second adjustment changes the duty cycle in an opposite manner as the first adjustment changes the duty cycle.

8. A method, comprising:
issuing a first mode register write command to write a first duty cycle adjuster code associated with a first step size to a first mode register to set a duty cycle adjuster circuit;
issuing a second mode register write command to write a first value to first opcode of a second mode register to start a duty cycle monitor operation;
issuing a third mode register write command to write a second value to a second opcode of the second mode register to flip an input condition for a duty cycle monitor circuit;
issuing a fourth mode register write command to write a third value to the first opcode to stop the first duty cycle monitor operation;
issuing a first mode register read command to read duty cycle results from the duty cycle monitor operation;
comparing the duty cycle results from the duty cycle monitor operation to duty cycle results from a previous duty cycle monitor operation; and
issuing a fifth mode register write command to write a second duty cycle adjuster code to the first mode register to set the duty cycle adjuster circuit, wherein a second step size associated with the second duty cycle adjuster code is based, at least in part, on the comparing.

9. The method of claim 8, wherein the second step size is different than the first step size when the duty cycle results of the duty cycle monitor operation indicate a duty cycle condition that is opposite of the duty cycle condition indicated by the duty cycle results from the previous duty cycle monitor operation.

10. The method of claim 8, wherein the duty cycle results are read from a third opcode of the second mode register.

11. The method of claim 10, wherein the first and second opcodes are write-only opcodes and the third opcode is read-only.

12. The method of claim 8, wherein the duty cycle results comprise a first result corresponding to a higher byte of data and a second result corresponding to a lower byte of data, wherein the first result is stored as a third opcode and the second result is stored as a fourth opcode.

13. The method of claim 8, wherein the duty cycle adjuster affects a duty cycle of a data clock signal based, at least in part, on the first duty cycle adjuster code or the second duty cycle adjuster code.

14. The method of claim 8, wherein a variation of the duty cycle between the first duty cycle adjuster code and the second duty cycle adjuster code is nonlinear.

15. An apparatus comprising:
a first mode register comprising a first opcode;
a duty cycle adjuster circuit configured to adjust a duty cycle of a clock signal based on a value of the first opcode;
a second mode register comprising a second opcode and a third opcode; and
a duty cycle monitor circuit configured to:
perform a duty cycle monitor operation when the second opcode has a first value;
provide a duty cycle result to second mode register to set a value of the third opcode; and
stop the duty cycle monitor operation when the second opcode has a second value.

16. The apparatus of claim 15, wherein the second mode register further comprises a fourth opcode, wherein an input of the duty cycle monitor circuit is flipped based on a value of the fourth opcode.

17. The apparatus of 15, wherein the duty cycle adjuster affects the data clock signal during at least one of a read, read32, write, write32, masked write, mode register read, read first-in-first-out (FIFO), write FIFO, read DQ calibration, or the duty cycle monitor operation of a memory.

18. The apparatus of claim 15, wherein the second mode register comprises eight opcodes including the second and third opcodes, wherein each of the eight opcodes comprises a bit.

19. The apparatus of claim 15, wherein the second opcode is a write opcode and the third opcode is a read opcode.

20. The apparatus of claim 15, further comprising a controller communicatively coupled to the first register and the second register, wherein the controller is configured to:
write a first duty cycle code to set the value of the first opcode;
read the duty cycle result for the first duty cycle code of the third opcode, wherein the duty cycle result indicates a duty cycle condition for a first adjustment to the duty cycle of the clock signal; and
write a second duty cycle code to set the value of the first opcode when the duty cycle result indicates a change in the duty cycle condition associated with the first duty cycle code and a previous duty cycle code, wherein the second duty cycle code is associated with a second adjustment to the duty cycle, wherein the second adjustment has a different size than the first adjustment.

* * * * *